US007239209B2

(12) United States Patent
Adan

(10) Patent No.: US 7,239,209 B2
(45) Date of Patent: Jul. 3, 2007

(54) SERIALLY RC COUPLED QUADRATURE OSCILLATOR

(75) Inventor: Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 69 days.

(21) Appl. No.: 11/253,732

(22) Filed: Oct. 20, 2005

(65) Prior Publication Data

US 2006/0097801 A1 May 11, 2006

(30) Foreign Application Priority Data

Oct. 21, 2004 (JP) ............................. 2004-307203

(51) Int. Cl.
*H03B 27/00* (2006.01)
(52) U.S. Cl. ............... 331/117 R; 331/45; 331/117 FE
(58) Field of Classification Search ............ 331/117 R, 331/45
See application file for complete search history.

(56) References Cited

U.S. PATENT DOCUMENTS

| 5,912,596 | A | 6/1999 | Ghoshal |
| 6,404,293 | B1 | 6/2002 | Darabi et al. |
| 6,456,167 | B1 | 9/2002 | Huang |
| 6,639,481 | B1 | 10/2003 | Ravi et al. |
| 2002/0093385 | A1 | 7/2002 | Nishiyama et al. |
| 2002/0109556 | A1 | 8/2002 | Leenaerts et al. |
| 2004/0061563 | A1* | 4/2004 | Akeyama et al. ........ 331/117 R |
| 2004/0150484 | A1* | 8/2004 | Jacobsson et al. ....... 331/117 R |

FOREIGN PATENT DOCUMENTS

JP  30-5043  7/1955

OTHER PUBLICATIONS

A. Rofougaran et al., "A 900MHz CMOS LC-Oscillator with quadrature outputs," Int. Solid-State Circuits Conference, San Francisco, CA, 1996.

J. van der Tang et al., "Analysis and design of an optimally coupled 5-GHz quadrature LC oscillator," IEEE journal of Solid-State Circuits, vol. 37, No. 5, May 2002, pp. 657-661.

P. Andreani et al., "Analysis and design of a 1.8-GHz CMOS LC quadrature VCO," IEEE journal of Solid-State Circuits, vol. 37, No. 12, Dec. 2002, pp. 1737-1747.

* cited by examiner

*Primary Examiner*—Joseph Chang
(74) *Attorney, Agent, or Firm*—Harness, Dickey & Pierce, P.L.C.

(57) ABSTRACT

The oscillator includes: a first oscillator circuit in which first and second transistors cross-connected to each other are connected to a resonant circuit; and a second oscillator circuit in which third and fourth transistors cross-connected to each other are connected to a resonant circuit, wherein a coupling capacitor and coupling resistor are serially provided between a collector terminal of the first transistor and a base terminal of the fourth transistor, and a coupling capacitor and coupling resistor are serially provided between a collector terminal of the second transistor and a base terminal of the third transistor, and a coupling capacitor and coupling resistor are serially provided between a collector terminal of the third transistor and a base terminal of the first transistor, and a coupling capacitor and coupling resistor are serially provided between a collector terminal of the fourth transistor and a base terminal of the second transistor. On this account, it is possible to suppress noises and reduce power consumption.

13 Claims, 14 Drawing Sheets

SERIALLY RC COUPLED QUADRATURE OSCILLATOR

This Nonprovisional application claims priority under 35 U.S.C. § 119(a) on Patent Application No. 307203/2004 filed in Japan on Oct. 21, 2004, the entire contents of which are hereby incorporated by reference.

FIELD OF THE INVENTION

The present invention relates to an oscillator, particularly to a voltage controlled oscillator for generating a quadrature signal.

BACKGROUND OF THE INVENTION

A communication device, such as a mobile phone, includes a voltage controlled oscillator as a local oscillator. The voltage controlled oscillator is required to have the accuracy of signal Generation (for example, quadrature signals which are 90° out of phase with each other), and in addition to this, a simpler circuit and lower power consumption for realizing a mobile system.

FIGS. 9 to 15 show conventional structures of an oscillator for generating a quadrature signal.

An oscillator (hereinafter referred to as a first conventional technique) shown in FIGS. 9(a) and 9(b) uses a voltage controlled oscillator (VCO), running at twice the frequency of the desired quadrature signals, and a divide-by-two circuit shown in FIG. 9(a). The divide-by-two circuit is usually a digital master-slave flip flop circuit. In the digital master-slave flip flop circuit, outputs Q and QB of a mater flip flop are connected with inputs D and DB of a slave flip flop, respectively, and outputs Q and QB of the slave flip flop are fed back to inputs DB and B of the master flip flop, respectively. Note that an oscillating signal (a signal having twice the frequency of the desired signal, see FIG. 9(b)) from the VCO is used as a CLK signal. Therefore, the outputs (Q and QB) of each flip flop are 180° out of phase, and the output Q (QB) of the master flip flop and the output Q (QB) of the slave flip flop are 90° out of phase (see FIG. 9(b)). That is, the output Q (QB) of the master flip flop can be used for an f signal, and the output Q (QB) of the slave flip flop can be used for a Q signal.

Moreover, oscillators (hereinafter referred to as a second conventional technique) disclosed in Patent Document 1 (U.S. Pat. No. 6,404,293 B1) and Non-Patent Document 1 (A. Rofougaran et al., "A 900 MHz CMOS LC oscillator with quadrature outputs," Int. Solid-State Circuits Conference, San Francisco, Calif, 1996, pp. 316–317.) are arranged as follows.

As shown in FIG. 10, each of paired oscillator circuits A and B includes two coils, two capacitors, two N-channel MOS transistors cross-connected with each other, and a constant current source.

For example, in the oscillator circuit A, a coil 826 and a capacitor 827 are connected in parallel with each other between a high potential end power source and a drain terminal of an N-channel MOS transistor 818. Moreover, a coil 828 and a capacitor 829 are connected in parallel with each other between the high potential end power source and a drain terminal of an N-channel MOS transistor 820. Further, a gate terminal of the MOS transistor 818 is connected with the drain terminal of the MOS transistor 820, and a gate terminal of the MOS transistor 820 is connected with the drain terminal of the MOS transistor 818. Further, a source terminal of the MOS transistor 818 and a source terminal of the MOS transistor 820 are connected with a constant current source 810.

The oscillator circuits A and B are connected with each other via four MOS transistors (834, 836, 838 and 840). For example, a drain terminal of the N-channel MOS transistor 834 is connected with the drain terminal of the MOS transistor 818 of the oscillator circuit A, a gate terminal of the N-channel MOS transistor 834 is connected with a drain terminal of a MOS transistor 824 of the oscillator circuit B, and a source terminal of the N-channel MOS transistor 834 is connected with the constant current source. Moreover, a drain terminal of the N-channel MOS transistor 838 is connected with a drain terminal of a MOS transistor 822 of the oscillator circuit B, a gate terminal of the N-channel MOS transistor 838 is connected with the drain terminal of the MOS transistor 818 of the oscillator circuit A, and a source terminal of the N-channel MOS transistor 838 is connected with the constant current source.

Moreover, an oscillator (hereinafter referred to as a third conventional technique) disclosed in Patent Document 2 (U.S. Pat. No. 5,912,596) is arranged as follows.

As shown in FIG. 11, each of paired oscillator circuits A and B includes one P-channel MOS transistor, two coils, one variable capacitor, four N-channel MOS transistors and a constant current source.

For example, in the oscillator circuit A, a coil 52 is connected between a drain terminal of a P-channel MOS transistor 82 and an N-channel MOS transistor 76, and a coil 50 is connected between the drain terminal of the MOS transistor 82 and an N-channel MOS transistor 74. A source terminal of the MOS transistor 82 is connected with a Vdd, and a gate terminal of the MOS transistor 82 is connected with a bias. Moreover, a variable capacitor 56 is provided between a drain terminal of the MOS transistor 74 and a drain terminal of the MOS transistor 76. Further, a source terminal of the MOS transistor 74, a source terminal of the MOS transistor 76, a source terminal of a MOS transistor 72 and a source terminal of a MOS transistor 78 are connected with each other, and those are connected with the current source. Further, a drain terminal of the MOS transistor 72 is connected with a gate terminal of the MOS transistor 76, and a drain terminal of the MOS transistor 78 is connected with a gate terminal of the MOS transistor 74.

The oscillator circuits A and B are connected with each other via electrodes of eight MOS transistors (60, 62, 64, 66, 72, 74, 76 and 78) and two variable capacitors 46 and 48. For example, a gate terminal of the MOS transistor 78 of the oscillator circuit A is connected with a drain terminal of the MOS transistor 62 of the oscillator circuit B. A gate terminal of the MOS transistor 72 of the oscillator circuit A is connected with a drain terminal of the MOS transistor 64 of the oscillator circuit B. Moreover, two variable capacitors 46 and 48 are connected in parallel with each other between the drain terminal of the MOS transistor 74 and the drain terminal of the MOS transistor 64.

Moreover, an oscillator (hereinafter referred to as a fourth conventional technique) disclosed in Patent Document 3 (U.S. Pat. No. 6,639,481 B1) is arranged as follows.

As shown in FIG. 12, each of paired oscillator circuits A and B includes two P-channel MOS transistors cross-connected with each other, six variable capacitors, two N-channel MOS transistors cross-connected with each other, and a variable constant current source.

For example, in the oscillator circuit A, a source terminal of a P-channel MOS transistor 54 is connected with a source terminal of a P-channel MOS transistor 56, a gate terminal of the MOS transistor 54 is connected with a drain terminal of the MOS transistor 56, and a gate terminal of the MOS transistor 56 is connected with a drain terminal of the MOS transistor 54. Moreover, a source terminal of an N-channel MOS transistor 58 is connected with a source terminal of the N-channel MOS transistor 60, and those are connected with a constant current source 62. Further, a gate terminal of the MOS transistor 58 is connected with a drain terminal of the MOS transistor 60, and a gate terminal of the MOS transistor 60 is connected with a drain terminal of the MOS transistor 58. Moreover, the drain terminal of the MOS transistor 56 is connected with the drain terminal of the MOS transistor 60, and the drain terminal of the MOS transistor 54 is connected with the drain terminal of the MOS transistor 58. Moreover, two variable capacitors 64 and 66 are serially connected with each other between the drain terminal of the MOS transistor 54 and the drain terminal of the MOS transistor 56. Moreover, four variable capacitors 68, 70, 72 and 74 are serially connected with each other between the drain terminal of the MOS transistor 54 and the drain terminal of the MOS transistor 56.

Two oscillator circuits A and B are connected with each other via two transformers 25 and 27. For example, the transformer 25 includes two windings, and one end of one winding is connected between the variable capacitors 68 and 70 in the oscillator circuit A, and another end of the winding is connected between the variable capacitors 72 and 74 in the oscillator circuit A. Moreover, one end of another winding is connected with a drain terminal of an N-channel MOS transistor 18 in the oscillator circuit B, and another end of the winding is connected with a drain terminal of an N-channel MOS transistor 20.

As shown in FIGS. 13, 14(a) to 14(d) and 15, Patent Document 4 (U.S. Pat. No. 6,456,167 B1) and Non-Patent Documents 2 (J. van der Tang, et al., "Analysis and design of an optimally coupled 5-GHz quadrature LC oscillator," IEEE Journal of Solid-State Circuits, vol. 37, No. 5, May 2002, pp. 657–661.) and 3 (P. Andreani et al., "Analysis and design of a 1.8-GHz CMOS LC quadrature VCO," IEEE Journal of Solid-State Circuits, vol. 37, No. 12, December 2002, pp. 1737–1747.) disclose an arrangement in which paired oscillators are connected with each other via MOS transistors.

However, the first conventional technique requires a VCO which runs at twice the desired frequency. On this account, the power consumption of the oscillator increases, and the circuit (flip flop circuit) design becomes complex.

Moreover, in the second and third conventional techniques and conventional techniques disclosed in Patent Documents 5 to 7, a large number of MOS transistors that are active elements are used for connecting two oscillator circuits with each other. On this account, noise (phase noise, etc.) is easily generated, and the power consumption increases. In addition, a circuit area increases.

Moreover, in the fourth conventional technique, the variable capacitors (varactors) and the transformers are used for connecting two oscillator circuits with each other. On this account, a circuit area increases, and the power consumption also increases.

SUMMARY OF THE INVENTION

The present invention was made in view of the above problems, and an object of the present invention is to provide an oscillator which realizes less noise and lower power consumption.

In order to solve the above problem, an oscillator of the present invention includes: a first oscillator circuit which has a resonant circuit and a plurality of transistors; and a second oscillator circuit which has a resonant circuit and a plurality of transistors, wherein: the first oscillator circuit is provided with first and second transistors so that a first conductive terminal of the first transistor is connected to a first conductive terminal of the second transistor and a second conductive terminal of the first transistor and a second conductive terminal of the second transistor are respectively connected to the resonant circuit, and the second conductive terminal of the first transistor is connected to a control terminal of the second transistor directly or via a capacitor, and a control terminal of the first transistor is connected to the second conductive terminal of the second transistor directly or via a capacitor, and the second oscillator circuit is provided with third and fourth transistors so that a first conductive terminal of the third transistor is connected to a first conductive terminal of the fourth transistor and a second conductive terminal of the third transistor and a second conductive terminal of the fourth transistor are respectively connected to the resonant circuit, and the second conductive terminal of the third transistor is connected to a control terminal of the fourth transistor directly or via a capacitor, and a control terminal of the third transistor is connected to the second conductive terminal of the fourth transistor directly or via a capacitor, and a coupling capacitor and a coupling resistor are serially provided between the second conductive terminal of the first transistor and the control terminal of the fourth transistor, and a coupling capacitor and a coupling resistor are serially provided between the second conductive terminal of the second transistor and the control terminal of the third transistor, and a coupling capacitor and a coupling resistor are serially provided between the second conductive terminal of the third transistor and the control terminal of the first transistor, and a coupling capacitor and a coupling resistor are serially provided between the second conductive terminal of the fourth transistor and the control terminal of the second transistor.

In the above arrangement, the resonant circuit generates an alternating signal whose frequency is a resonance frequency.

Further, the first and second transistors are connected to each other at their first conductive terminals (emitter terminals or source terminals), the second conductive terminal of the first transistor is connected directly or via the capacitor to the control terminal of the second transistor, and the control terminal of the first transistor is connected directly or via the capacitor to the second conductive terminal of the second transistor. The thus cross-connected first and second transistors make up a negative resistance circuit. The negative resistance circuit is connected via the second conductive terminals of the first and second transistors to the resonant circuit (resonant circuit belonging to the first oscillator circuit). For example, the resonant circuit is connected in parallel with the first and second resistors between the second conductive terminals of the first and second transistors. With this arrangement, losses in the resonant circuit (losses caused by parasitic resistance or others) are compensated by the negative resistance circuit, which allows the resonant circuit to continue oscillations. Thus, the first oscillator circuit outputs an alternating signal.

The second oscillator circuit is arranged in the same fashion as the first oscillator circuit. That is, the cross-connected third and fourth transistors make up a negative resistance circuit. The negative resistance circuit is connected via the second conductive terminals of the third and fourth transistors to the resonant circuit (resonant circuit belonging to the second oscillator circuit). For example, the resonant circuit is connected with the third and fourth transistors between the second conductive terminals of the third and fourth transistors. With this arrangement, losses in the resonant circuit (losses caused by parasitic resistance or others) are compensated by the negative resistance circuit, which allows the resonant circuit to continue oscillations. Thus, the second oscillator circuit outputs an alternating signal.

Moreover, the transistors belonging to the first oscillator circuit are connected to the transistors belonging to the second oscillator circuit by using an RC coupling which is realized by a resistor and a capacitor. This allows an output signal of the second oscillator circuit to be phase shifted by 90° from an output signal of the first oscillator circuit. Thus, alternating signals outputted from the respective first and second oscillator circuits are 90° out of phase with each other.

Here, as previously described, the present invention uses series-connected coupling resistor and coupling capacitor for the coupling between the transistors belonging to the first oscillator circuit and the transistors belonging to the second oscillator circuit. Therefore, the arrangement of the present invention reduces noise generation as compared with the conventional arrangement using a transistor coupling, a transformer coupling, or the like. Besides, the arrangement of the present invention reduces transistor counts, thus realizing lower power consumption and scale-down of a circuit.

Note that, the coupling resistor may be of a minimal value, like parasitic resistance. In this case, the coupling between the oscillator circuits is close to a capacitive coupling.

In order to solve the above problem, an oscillator of the present invention includes: a first oscillator circuit which has a resonant circuit and a plurality of transistors; and a second oscillator circuit which has a resonant circuit and a plurality of transistors, wherein: the first oscillator circuit is provided with (i) first and second MOS transistors so that a first conductive terminal of the first MOS transistor is connected to a first conductive terminal of the second MOS transistor and a second conductive terminal of the first MOS transistor is connected to a second conductive terminal of the second MOS transistor and (ii) third and fourth MOS transistors so that a first conductive terminal of the third MOS transistor is connected to a first conductive terminal of the fourth MOS transistor and a second conductive terminal of the third MOS transistor is connected to a second conductive terminal of the fourth MOS transistor, and the first conductive terminal of the second MOS transistor is connected to the first conductive terminal of the third MOS transistor, and the second conductive terminal of the second MOS transistor and the second conductive terminal of the third MOS transistor are respectively connected to the resonant circuit, and the second conductive terminal of the second MOS transistor is connected to a control terminal of the third MOS transistor, and a control terminal of the second MOS transistor is connected to the second conductive terminal of the third MOS transistor, and the second oscillator circuit is provided with (i) fifth and sixth MOS transistors so that a first conductive terminal of the fifth MOS transistor is connected to a first conductive terminal of the sixth MOS transistor and a second conductive terminal of the fifth MOS transistor is connected to a second conductive terminal of the sixth MOS transistor and (ii) seventh and eighth MOS transistors so that a first conductive terminal of the seventh MOS transistor is connected to a first conductive terminal of the eighth MOS transistor and a second conductive terminal of the seventh MOS transistor is connected to a second conductive terminal of the eighth MOS transistor, and the first conductive terminal of the sixth MOS transistor is connected to the first conductive terminal of the seventh MOS transistor, and the second conductive terminal of the sixth MOS transistor and the second conductive terminal of the seventh MOS transistor are respectively connected to the resonant circuit, and the second conductive terminal of the sixth MOS transistor is connected to a control terminal of the seventh MOS transistor, and a control terminal of the sixth MOS transistor is connected to the second conductive terminal of the seventh MOS transistor, and a coupling capacitor and a coupling resistor are serially provided between (a) the second conductive terminals of the fifth and sixth MOS transistors and (b) the control terminal of the first MOS transistor, and a coupling capacitor and a coupling resistor are serially provided between (c) the second conductive terminals of the seventh and eighth MOS transistors and (d) the control terminal of the fourth MOS transistor, and a coupling capacitor and a coupling resistor are serially provided between (e) the second conductive terminals of the third and fourth MOS transistors and (f) the control terminal of the fifth MOS transistor, and a coupling capacitor and a coupling resistor are serially provided between (g) the second conductive terminals of the first and second MOS transistors and (h) the control terminal of the eighth MOS transistor.

Each of the conductive terminals corresponds to a source terminal or a drain terminal of the MOS transistor, and each of the control terminals corresponds to a gate terminal of the MOS transistor.

According to the above arrangement, series-connected resistor and capacitor are used for the coupling between the transistors belonging to the first oscillator circuit and the transistors belonging to the second oscillator circuit. Therefore, the arrangement of the present invention reduces noise generation as compared with the conventional arrangement using a transistor coupling, a transformer coupling, or the like. Besides, the arrangement of the present invention reduces transistor counts, thus realizing lower power consumption and scale-down of a circuit.

DESCRIPTION OF THE EMBODIMENTS

The following will describe one embodiment of the present invention with reference to FIGS. 1 through 8.

Figure 4:
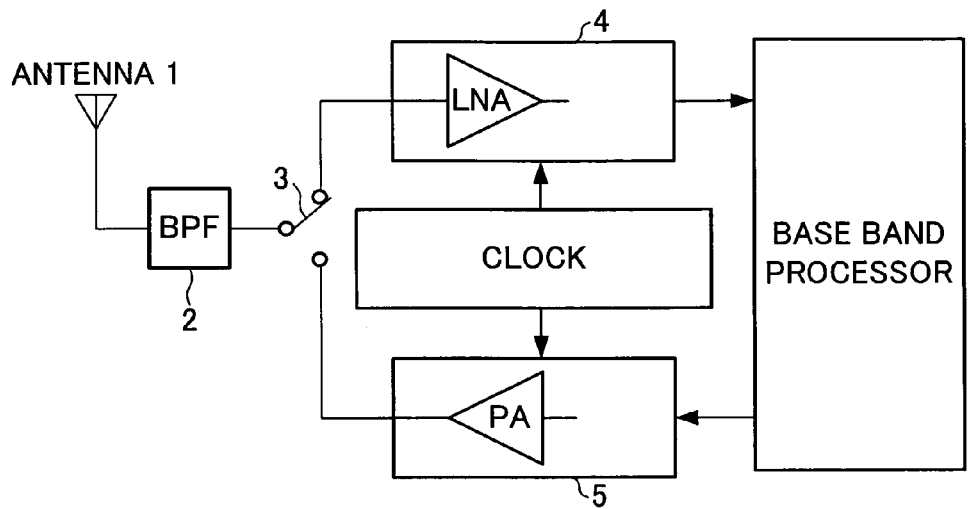
FIG. 4 is a circuit diagram illustrating a general structure of a communication device using the present oscillator.

First of all, a data transmission system (communication device) using an oscillator of the present invention is described. As illustrated in FIG. 4, an RF transceiver section (radio frequency signal transceiver section) of a data transmission system, such as mobile phone, uses a clock synthesizer (such as oscillator or mixer) to (a) downconvert a radio frequency signal received at an antenna to a lower-frequency signal (base-band signal or intermediate frequency signal), and to (b) upconvert a signal outputted from a base-band processor to a radio frequency signal to be transmitted at the antenna.

Figure 5:
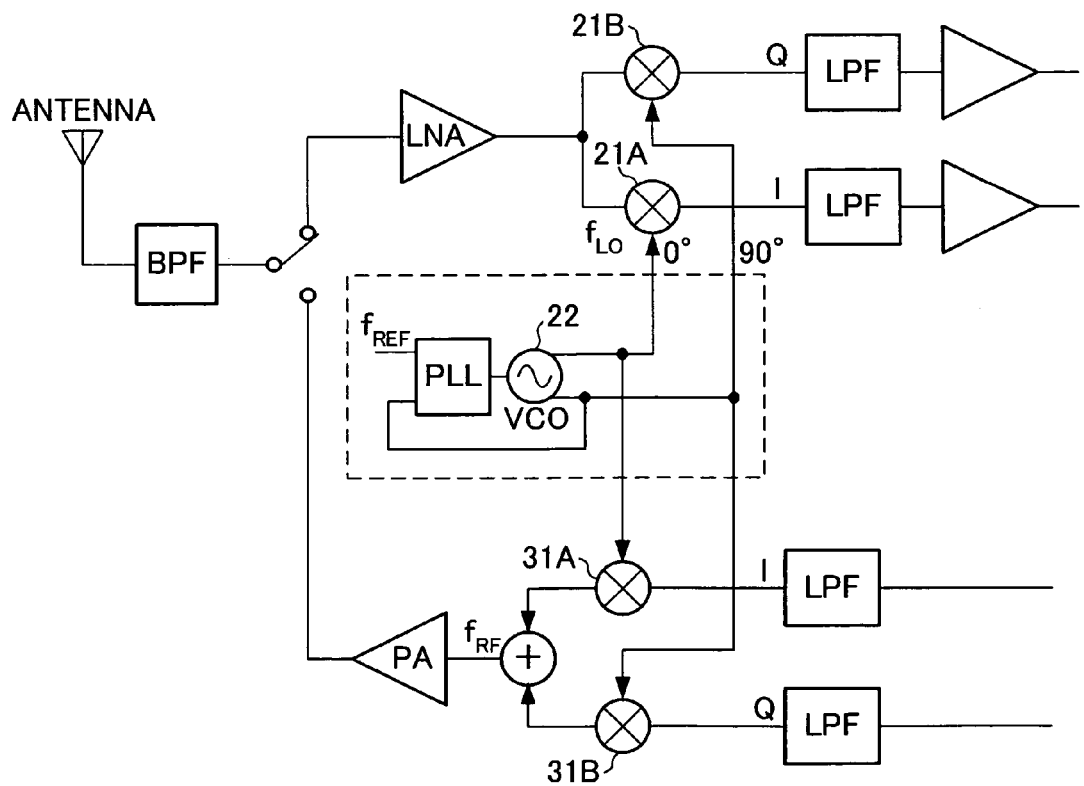
FIG. 5 is a circuit diagram illustrating a structure of a communication device (direct conversion architecture) using the present oscillator.

In a direct conversion architecture illustrated in FIG. 5, in an RF transmitter section, a radio frequency signal received at the antenna is sent to a bandpass filter (BPF). The bandpass filter filters out high frequency components and low frequency components from the radio frequency signal. The signal having passed through the bandpass filter is sent to a low noise amplifier (LNA) for amplification with a low NF (noise factor). The signal having passed through the low noise amplifier is branched into two signals. One of the two branch signals is mixed with a reference phase signal, which is generated at a VCO (voltage control oscillator) 22 connected to a PLL circuit, by a mixer 21A for downconversion to a low-frequency I signal. Meanwhile, the other branch signal is mixed with a signal 90° out of phase with a reference phase having been generated in the VCO 22 by a mixer 21B for downconversion to a low-frequency Q signal. The I signal and the Q signal are sent to a lowpass filter for filtering of unwanted components from the I and Q signals. Also, in the RF transmitter section, an I signal having been sent from a lowpass filter (LPF) is mixed with the reference phase signal having been generated in the VCO 22 by a mixer 31A for upconversion. Meanwhile, a Q signal having been sent from the lowpass filter (LPF) is mixed with a signal 90° out of phase with the reference phase having been generated in the VCO 22 by a mixer 31B for upconversion. The I signal from the mixer 31A and the Q signal from the mixer 31B are combined into an RF (radio frequency) signal. The RF signal is amplified by an amplifier circuit (PA), passes through the BPF, and transmitted at the antenna.

Figure 6:
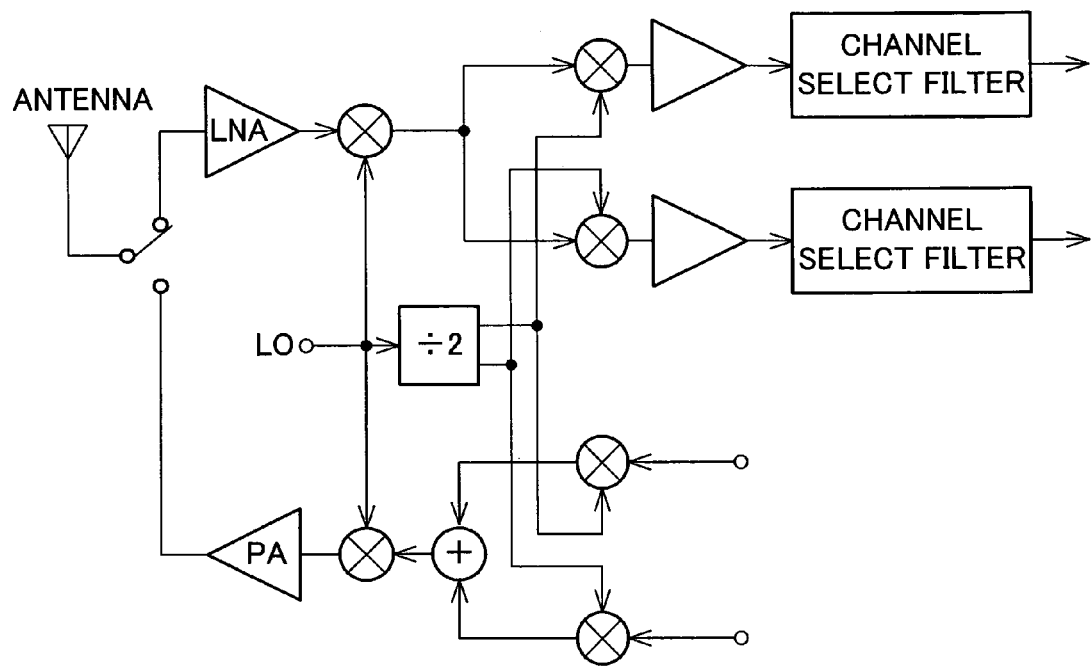
FIG. 6 is a circuit diagram illustrating a structure of a communication device (dual conversion architecture) using the present oscillator.
Figure 7:
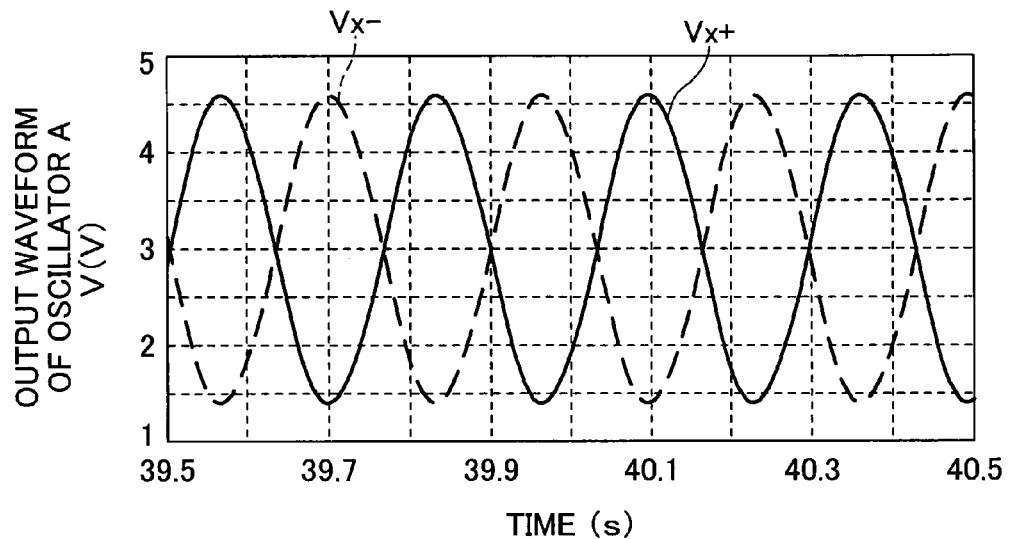
FIG. 7(a) and FIG. 7(b) are graphs each of which illustrates quadrature signals oscillated by the present oscillator.
Figure 7:
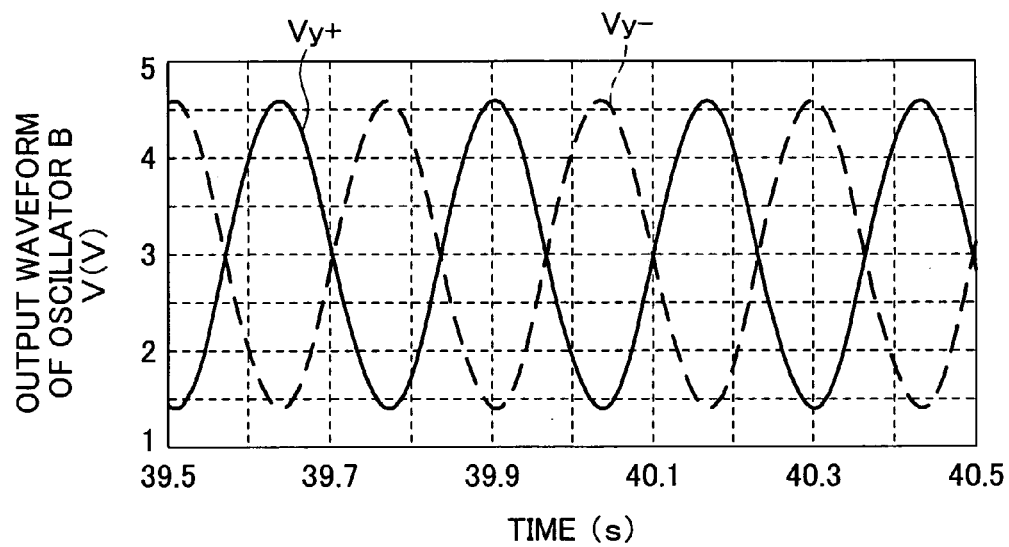

In a double conversion architecture illustrated in FIG. 6, in an RF transmitter section, a radio frequency signal having been received at the antenna is amplified with a low NF by a low noise amplifier (LNA) and then mixed with a signal from a VCO (1.5 GHz) for downconversion to an intermediate frequency signal. Further, the intermediate frequency signal is branched into two signals. One of the two branch signals is mixed with a divided reference phase signal (1.5/2 GHz) by a mixer for downconversion to a low-frequency I signal. Meanwhile, the other branch signal is mixed with a signal 90° out of phase with the divided reference phase by the mixer for downconversion to a low-frequency Q signal. The I signal and the Q signal are sent to respective channel-select filters. Also, in the RF transmitter section, an I signal having been sent from a base-band processor is mixed with a divided reference phase signal (1.5/2 GHz) by a mixer for upconversion to an intermediate frequency signal. Meanwhile, a Q signal having been sent from the base-band processor is mixed with a signal 90° out of phase with the divided reference phase by the mixer for upconversion to an intermediate frequency signal. These I and Q signals (intermediate frequency signals) are combined and then mixed with a signal (1.5 GHz) from the VCO for upconversion to an RF (radio frequency) signal. The RF (radio frequency) signal is amplified by an amplifier circuit (PA) and then transmitted at the antenna.

Thus, the communication device uses quadrature signals which are 90° out of phase with each other, and is provided with an oscillator (VCO: voltage control oscillator) which generates the quadrature signals.

First Embodiment

Figure 1:
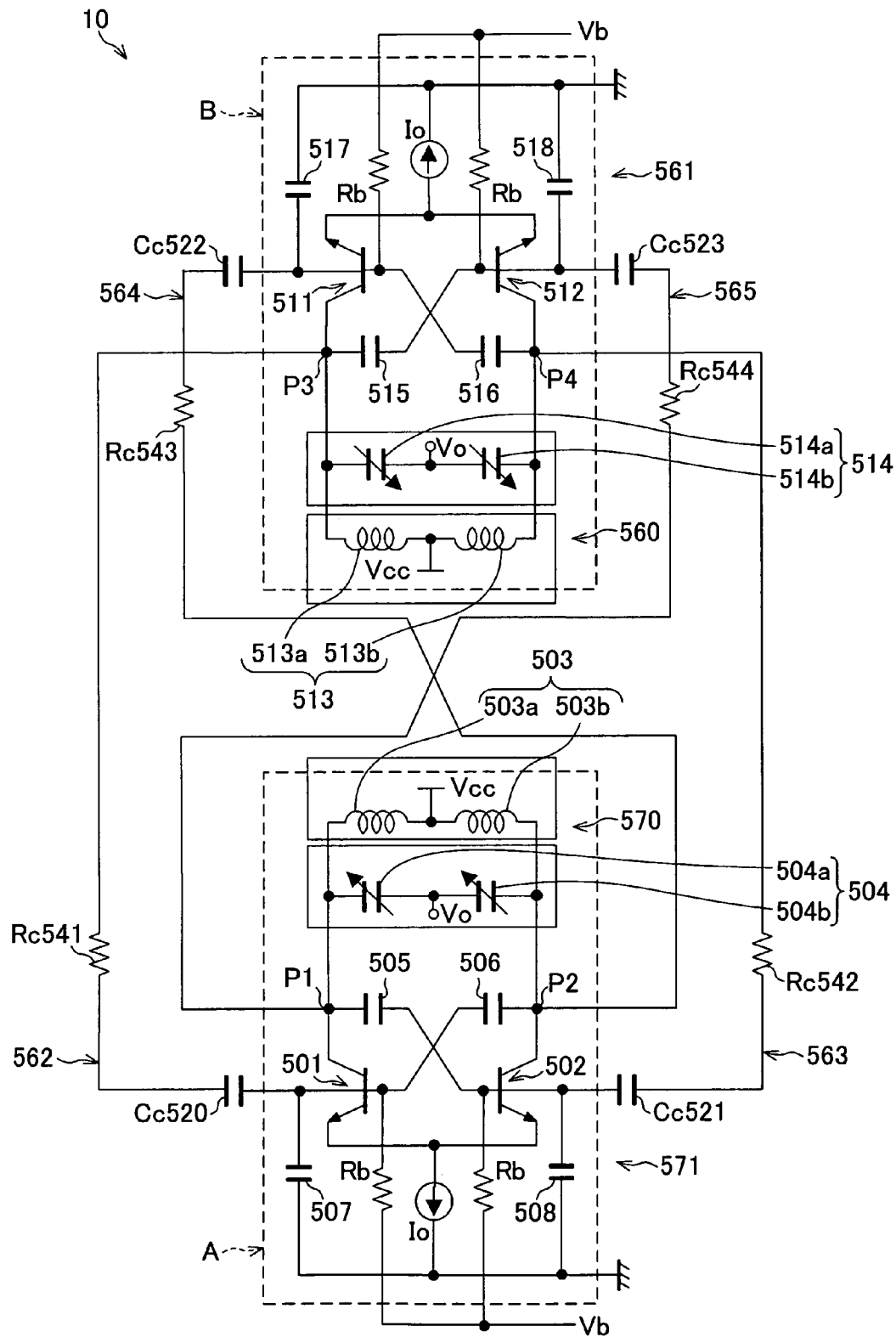
FIG. 1 is a circuit diagram illustrating a structure of an oscillator according to one embodiment of the present invention.

FIG. 1 is a circuit diagram illustrating a structure of an oscillator according to the present embodiment. As shown therein, an oscillator 10 (quadrature voltage controlled oscillator) includes a pair of an oscillator circuit A (first oscillator circuit) and an oscillator circuit B (second oscillator circuit) and four RC coupling networks 562 through 565. With this structure, the oscillator 10 generates four signals (quadrature signal) at P1 through P4. The four signals have 90° phase difference to each other.

The oscillator circuit A includes an LC resonant circuit 570 and a negative resistor circuit 571. The LC resonant circuit 570 includes a coil 503 (503a, 503b) and a varactor 504 (504a, 504b). The negative resistor circuit 571 includes two NPN transistors 501 and 502, four capacitors 505 (feedback capacitor), 506 (feedback capacitor), 507 and 508, two resistors Rb, and a current generator Io.

The coil 503a and 503b are connected in series, and the midpoint of the connection line is connected to Vcc. A varactor 504a and 504b are also connected in series, and the midpoint of the connection line is connected to Vo. Further, the coil 503 and the varactor 504 are cpnnected in parallel. More specifically, one end (the end opposite to the end connected to Vcc) of the coil 503a is connected to one electrode (the end opposite to the end connected to Vo) of the varactor 504a; and one end (the end opposite to the end connected to Vcc) of the coil 503b is connected to one electrode (the end opposite to the end connected to Vo) of the varactor 504b.

Further, one end (the end opposite to the end connected to Vo) of the varactor 504a is connected to a collector terminal of the transistor 501; and one end (the end opposite to the end connected to Vo) of the varactor 504b is connected to a collector terminal of the transistor 502.

Further, a base terminal of the transistor 501 is connected to a collector terminal of the transistor 502 via a capacitor 506, and a base terminal of the transistor 502 is connected to a collector terminal of the transistor 501 via a capacitor 505. More specifically, one electrode of the capacitor 505 is connected to the collector terminal of the transistor 501, while the other is connected to the base terminal of the transistor 502; meanwhile, one electrode of the capacitor 506 is connected to the collector terminal of the transistor 502, while the other is connected to the base terminal of the transistor 501.

Further, the base terminal of the transistor 501 is connected to a current generator Vb via a resistor Rb, and the base terminal of the transistor 502 is connected to the potential generator Vb via a resistor Rb. Further, the base terminal of the transistor 501 is connected to ground via the capacitor 507, and the base terminal of the transistor 502 is connected to ground via the capacitor 508. More specifically, one electrode of the capacitor 507 is connected to the base terminal of the transistor 501, while the other is connected to the ground.

Further, an emitter terminal of the transistor 501 is connected to an emitter terminal of the transistor 502. These emitter terminals of the transistors 501 and 502 are connected to the current generator Io (into an upstream terminal). The terminal extending downstream of the current generator Io is connected to ground.

The oscillator circuit B includes an LC resonant circuit 560 and a negative resistor circuit 561. The LC resonant circuit 560 includes a coil 513 (513a, 513b) and a varactor 514 (514a, 514b). The negative resistor circuit 561 includes two NPN transistors 511 and 512, four capacitors 515 (feedback capacitor), 516 (feedback capacitor), 517 and 518, two resistors Rb, and a current generator Io.

The coil 513a and 513b are connected in series, and the midpoint of the connection line is connected to Vcc. A varactor 514a and 514b are also connected in series, and the midpoint of the connection line is connected to Vo. Further, the coil 513 and the varactor 514 are connected in parallel. More specifically, one end (the end opposite to the end connected to Vcc) of the coil 513a is connected to one electrode (the end opposite to the end connected to Vo) of the varactor 514a; and one end (the end opposite to the end connected to Vcc) of the coil 513b is connected to one electrode (the end opposite to the end connected to Vo) of the varactor 514b.

Further, one end (the end opposite to the end connected to Vo) of the varactor 514a is connected to a collector terminal of the transistor 511; and one end (the end opposite to the end connected to Vo) of the varactor 514b is connected to a collector terminal of the transistor 512.

Further, the base terminal of the transistor 501 is connected to a collector terminal of the transistor 512 via a capacitor 516, and a base terminal of the transistor 512 is connected to a collector terminal of the transistor 511 via a capacitor 515. More specifically, one electrode of the capacitor 515 is connected to the collector terminal of the transistor 511, while the other is connected to the base terminal of the transistor 512; meanwhile, one electrode of the capacitor 516 is connected to the collector terminal of the transistor 512, while the other is connected to the base terminal of the transistor 511.

Further, the base terminal of the transistor 511 is connected to a potential generator Vb via a resistor Rb, and the base terminal of the transistor 512 is connected to the current generator Vb via a resistor Rb. Further, the base terminal of the transistor 511 is connected to ground via the capacitor 517, and the base terminal of the transistor 512 is connected to ground via the capacitor 518. More specifically, one electrode of the capacitor 517 is connected to the base terminal of the transistor 511, while the other is connected to the ground.

Further, an emitter terminal of the transistor 511 is connected to an emitter terminal of the transistor 512. A common emitter terminal of these transistors 511 and 512 are connected to the current generator Io (into an upstream terminal). The terminal extending downstream of the current generator Io is connected to ground.

In this example, the oscillator 10 is structured so that the oscillator circuit A and the oscillator circuit B are connected to each other via the four RC coupling networks 562 through 565.

In the RC coupling network 562, a coupling capacitor Cc520 and a coupling resistor Rc541 are connected in series between the base terminal of the transistor 501 and the collector terminal of the transistor 511. More specifically, one electrode of the coupling capacitor Cc520 is connected to the base terminal of the transistor 501, and the coupling resistor Rc541 is provided between the other electrode of the coupling capacitor Cc520 and the collector terminal of the transistor 511. In the RC coupling network 563, a coupling capacitor Cc521 and a coupling resistor Rc542 are connected in series between the base terminal of the transistor 502 and the collector terminal of the transistor 512. More specifically, one electrode of the coupling capacitor Cc521 is connected to the base terminal of the transistor 502, and the coupling resistor Rc542 is provided between the other electrode of the coupling capacitor Cc521 and the collector terminal of the transistor 512. In the RC coupling network 564, a coupling capacitor Cc522 and a coupling resistor Rc543 are connected in series between the base terminal of the transistor 511 and the collector terminal of the transistor 502. More specifically, one electrode of the coupling capacitor Cc522 is connected to the base terminal of the transistor 511, and the coupling resistor Rc543 is provided between the other electrode of the coupling capacitor Cc522 and the collector terminal of the transistor 502. In the RC coupling network 565, a coupling capacitor Cc523 and a coupling resistor Rc544 are connected in series between the base terminal of the transistor 512 and the collector terminal of the transistor 501. More specifically, one electrode of the coupling capacitor Cc523 is connected to the base terminal of the transistor 512, and the coupling resistor Rc544 is provided between the other electrode of the coupling capacitor Cc523 and the collector terminal of the transistor 501.

When the LC resonant circuit 570 receives some kind of electrical stimulation, the oscillator circuit A oscillates an alternating signal by oscillation of the LC resonant circuit 570, from an output terminal P1 (collector terminal of the transistor 501) and an output terminal P2 (collector terminal of the transistor 502). These signal outputted from the output terminals P1 and P2 are reverse-phase (complementary) signals. The frequency of this alternating signal is a resonant frequency of the LC resonant circuit 570, and can be adjusted by the varactors 504a and 504b serving to control voltage.

Similarly, in the oscillator circuit B, when the LC resonant circuit 550 receives some kind of electrical stimulation, an alternating signal is generated (oscillated) by oscillation of the LC resonant circuit 560 at an output terminal P3 (collector terminal of the transistor 511) and an output terminal P4 (collector terminal of the transistor 512). These signals outputted from the output terminals P3 and P4 are reverse-phase signals. The frequency of this alternating signal is a resonant frequency of the LC resonant circuit 560, and can be adjusted by the varactors 514a and 514b serving to control voltage.

However, if the oscillation is generated only by the LC resonant circuit 570, oscillation of each circuit of the oscillator circuit A will stop sooner or later, as energy loss occurs due to a parasitic resistor etc. Then, in view of this, a positive power-supply voltage is applied to a power-supply potential wiring Vcc, and the negative resistor circuit 571, including alternating coupling transistors 501 and 502 and feedback capacitors 505 and 506, is connected to the LC resonant circuit 570, so as to compensate the loss of the LC resonant circuit 570, thereby maintaining the oscillation of the LC resonant circuit 570. In this way, alternating signals are continuously fetched from the output terminals P1 and P2.

Similarly, in the oscillator circuit B, a positive power-supply voltage is applied to a power-supply potential wiring Vcc, and the negative resistor circuit 561, including alternating coupling transistors 511 and 512 and feedback capacitors 515 and 516, is provided, allowing compensation of the loss of the LC resonant circuit 560, thereby maintaining the oscillation of the LC resonant circuit 560. On this account, alternating signals are continuously fetched from the output terminals P3 and P4.

In the negative resistor circuit 571 of the oscillator circuit A, the emitter terminals of the alternating coupling transistors 501 and 502 are biased by the current generator Io, and this current generator Io allows setting of transconductance of the negative resistor circuit 571 to an arbitrary value. Further, each base terminal of the alternating coupling transistors 501 and 502 is supplied with a bias voltage from the potential generator Vb via the resistor Rb, thus being increased by a certain value of direct voltage. In this way, the bias points of the transistors 501 and 502 can be kept in a normal state.

Similarly, in the oscillator circuit B, in the negative resistor circuit 561, the emitter terminals of the alternating coupling transistors 511 and 512 are biased by the current generator Io, and this current generator Io allows setting of transconductance of the negative resistor circuit 561 to an arbitrary value. Further, each base terminal of the alternating coupling transistors 511 and 512 is supplied with a bias voltage from the potential generator Vb via the resistor Rb, thus being increased by a certain value of direct voltage. In this way, the bias points of the transistors 511 and 512 can be kept in a normal state.

The oscillator circuits A and B are designed to operate under the same condition and with the same oscillation frequency. For example, the free operation frequency f0 is expressed as follows when the oscillator circuit A is not coupled to oscillator circuit B.

$$f_O = \frac{1}{2\pi \times \sqrt{L \times C_{eff}}} \quad C_{eff} = C + \frac{C_1 \times C_2}{C_1 + C_2}$$

In the formula, C expresses capacitance of the varactor 504, C1 expresses capacitance of the capacitor 505 or 506, and C2 expresses capacitance of the capacitor 507 or 508. These reference marks are also used for the oscillator circuit B.

As mentioned above, the outputs of the respective oscillator circuits have 180° C. phase difference. For example, when the output of P1 (collector terminal of the transistor 501) is X, the output of P2 (collector terminal of the transistor 502) is −X. Similarly, when the output of P3 (collector terminal of the transistor 511) is Y, the output of P4 (collector terminal of the transistor 512) is −Y. Note that, the output voltages of the respective oscillator circuits from P1 through P3 are difference-voltage signals, each of values is determined by a difference from a corresponding predetermined potential.

In the oscillator 10, the oscillator circuit A and the oscillator circuit B are connected via the four RC coupling networks 562 through 565. With this layout in which the oscillator circuit A and the oscillator circuit B are connected via the four RC networks (Rc541·Cc520, Rc542·Cc521, Rc543·Cc522 and Rc544·Cc523), it is possible to make ±90° C. difference between the output signals X and Y (satisfying X=±jY) of the respective oscillator circuits (see FIGS. 7(a) and 7(b)). On this account, the output terminals P1 through P4 respectively output signals which differ in phase by 90° C. from each other. FIG. 7(a) illustrates a waveform (Vx+) of output signal from P1 and a waveform (Vx−) of output signal of P2 in the oscillator circuit A, while FIG. 7(b) illustrates a waveform (Vy+) of output signal from P3 and a waveform (Vy−) of output signal of P4 in the oscillator circuit B. As can be seen in these figures, Vx and Vy have ±90° C. phase difference. Note that, the frequency (oscillation frequency of the oscillator 10) of the output signal is about 3.5 GHz.

In this case, for example, the voltage V1 of the base terminal of the transistor 501 is expressed as: V1=α·X+ k·Ye$^{-j\Phi}$, where α denotes proportionality constant; and the collector current I1 (current in P1) is expressed as: I1=gm× V1, where gm denotes transconductance in the negative resistor circuit 571. Similarly, the voltage V2 of the base terminal of the transistor 511 is expressed as: V2=α·Y− k·Xe$^{-j\Phi}$, where α denotes proportionality constant; and the collector current I2 (current in P3) is expressed as: I2=gm× V2, where gm denotes transconductance in the negative resistor circuit 561. Note that, the proportionality constant α is determined depending on the setting of Rc and/or Cc of the RC coupling networks.

Further, the oscillation frequency fosc of the oscillator 10 can be found by the following formula.

$$f_{OSC} = f_a \times \left[ \sqrt{1 + \left(\frac{g_m k}{4\pi f_a C_{eq}}\right)^2} \pm \left(\frac{g_m k}{4\pi f_a C_{eq}}\right) \right]$$

However, fa (free operation frequency of each oscillator circuit under a load) and k can be found by the following formula.

$$f_a = \frac{1}{2\pi \times \sqrt{L \times C_{eq}}}$$

$$C_{eq} = C + \frac{C_c \times (C_1 + C_2) + C_1 \times (C_c + C_2)}{C_t}$$

$$C_t = C_1 + C_2 + C_c, \quad k = \frac{C_c}{C_t}$$

The foregoing equations can be used in designing the oscillator 10.

The coupling resistors Rc (541·542·543·544) control the phases of signals X and Y, as well as their amplifications. In view of this, the coupling resistor Rc is preferably constituted of a variable voltage control resistor, so as to adjust the phases of the signals X and Y. Here, when Rc becomes excessively large, the operations of the two oscillator circuits are almost separated. On the other hand, when Rc becomes close to 0 (e.g., when Rc is constituted only of the parasitic resistor), the connections between the RC coupling networks of the respective oscillator circuits substantially become capacitive connection.

Figure 8:
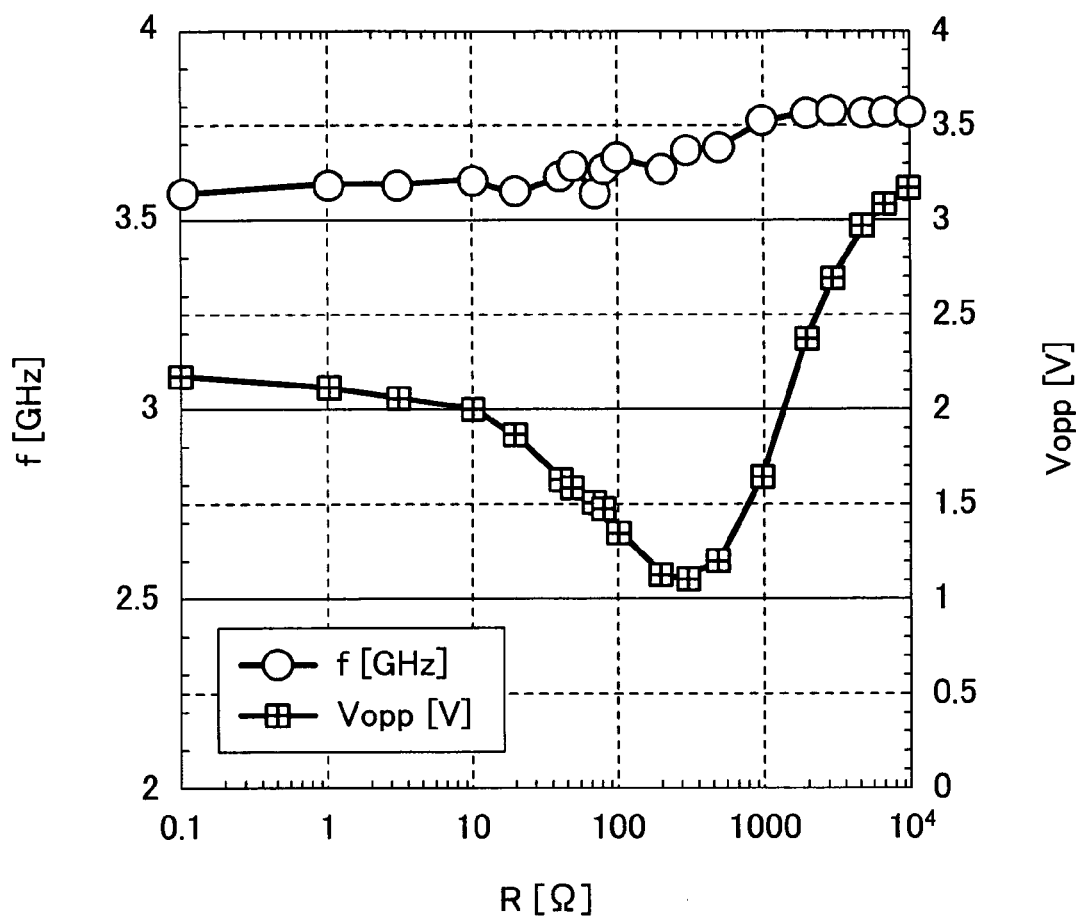
FIG. 8 is a graph illustrating coupling resistance dependencies of an oscillation frequency and a signal frequency of the present oscillator.
Figure 9:
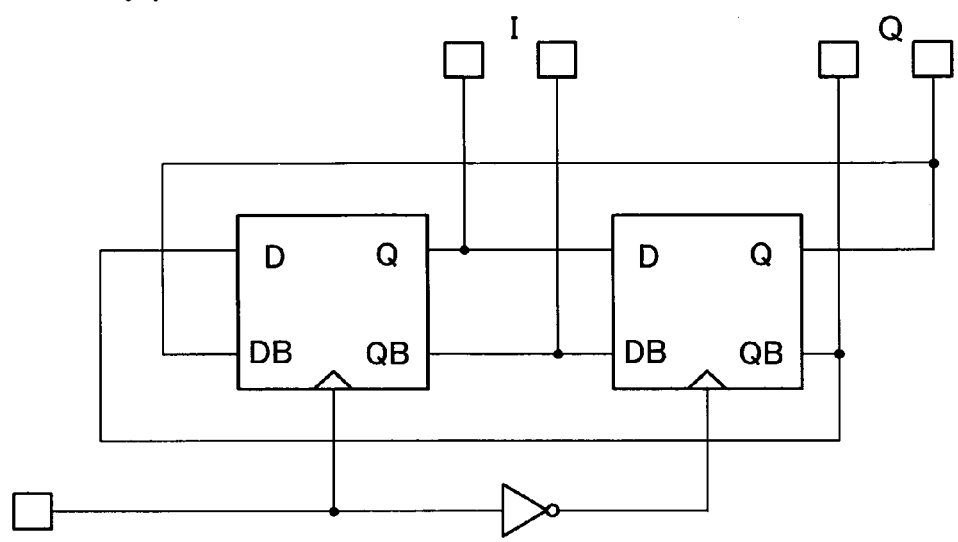
FIG. 9(a) and FIG. (9b) are diagrams each of which illustrates an arrangement of a conventional oscillator.
Figure 9:
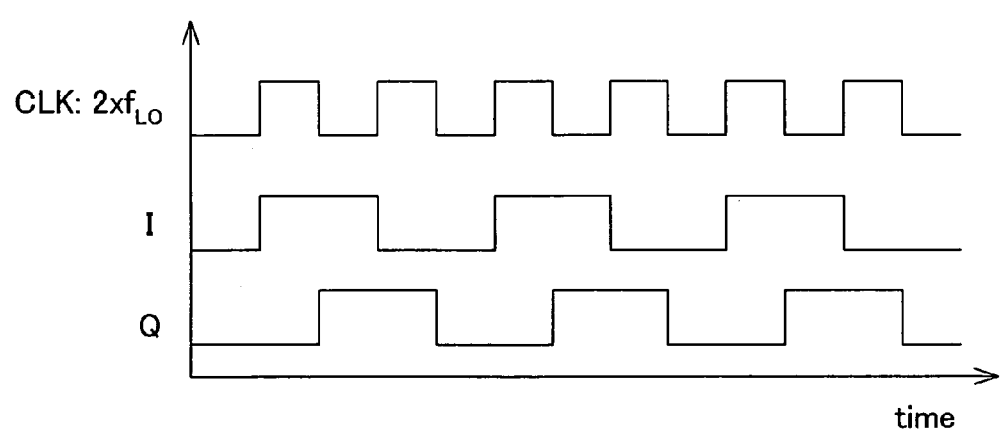
Figure 10:
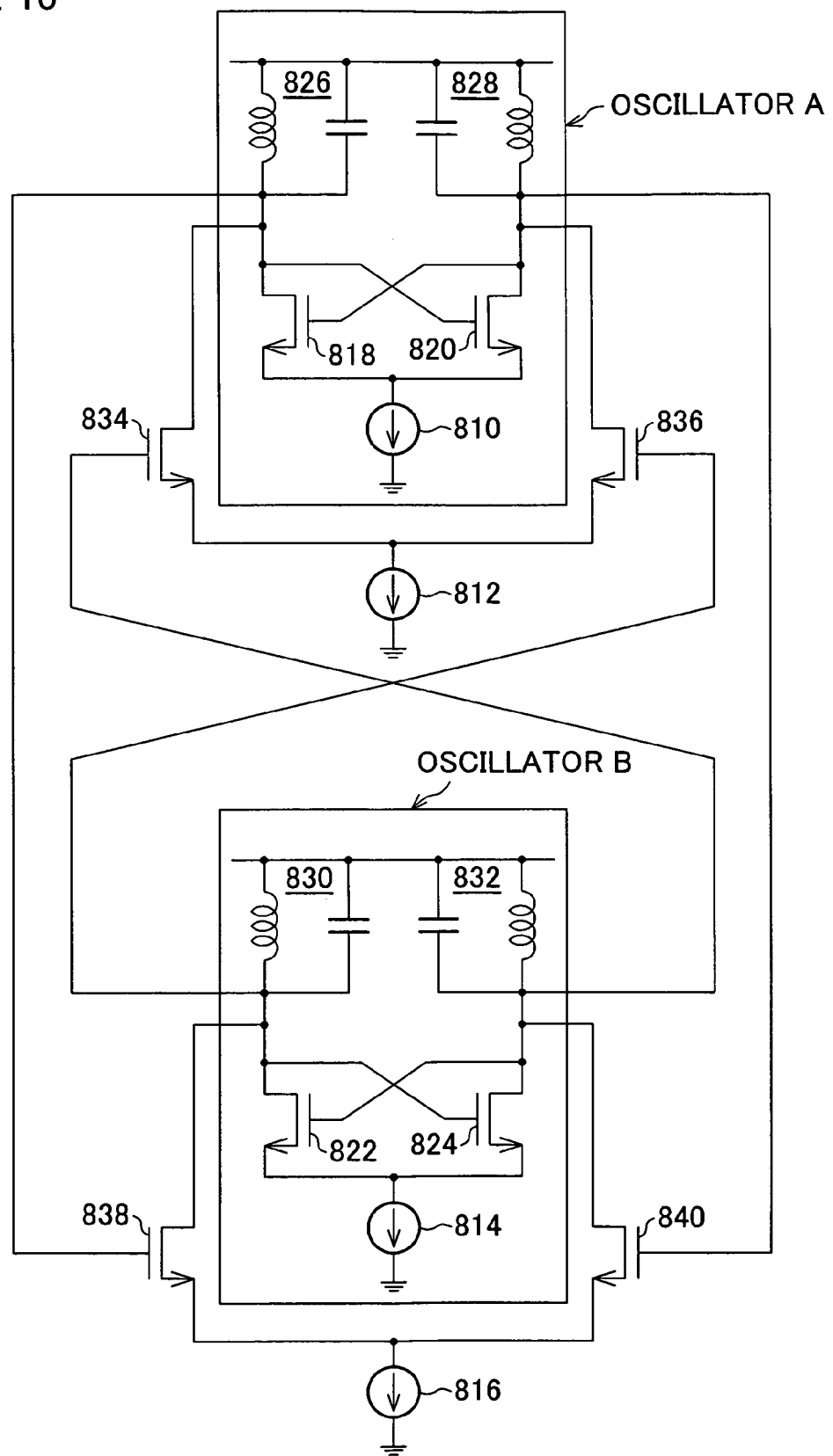
FIG. 10 is a circuit diagram illustrating a structure of a conventional oscillator.
Figure 11:
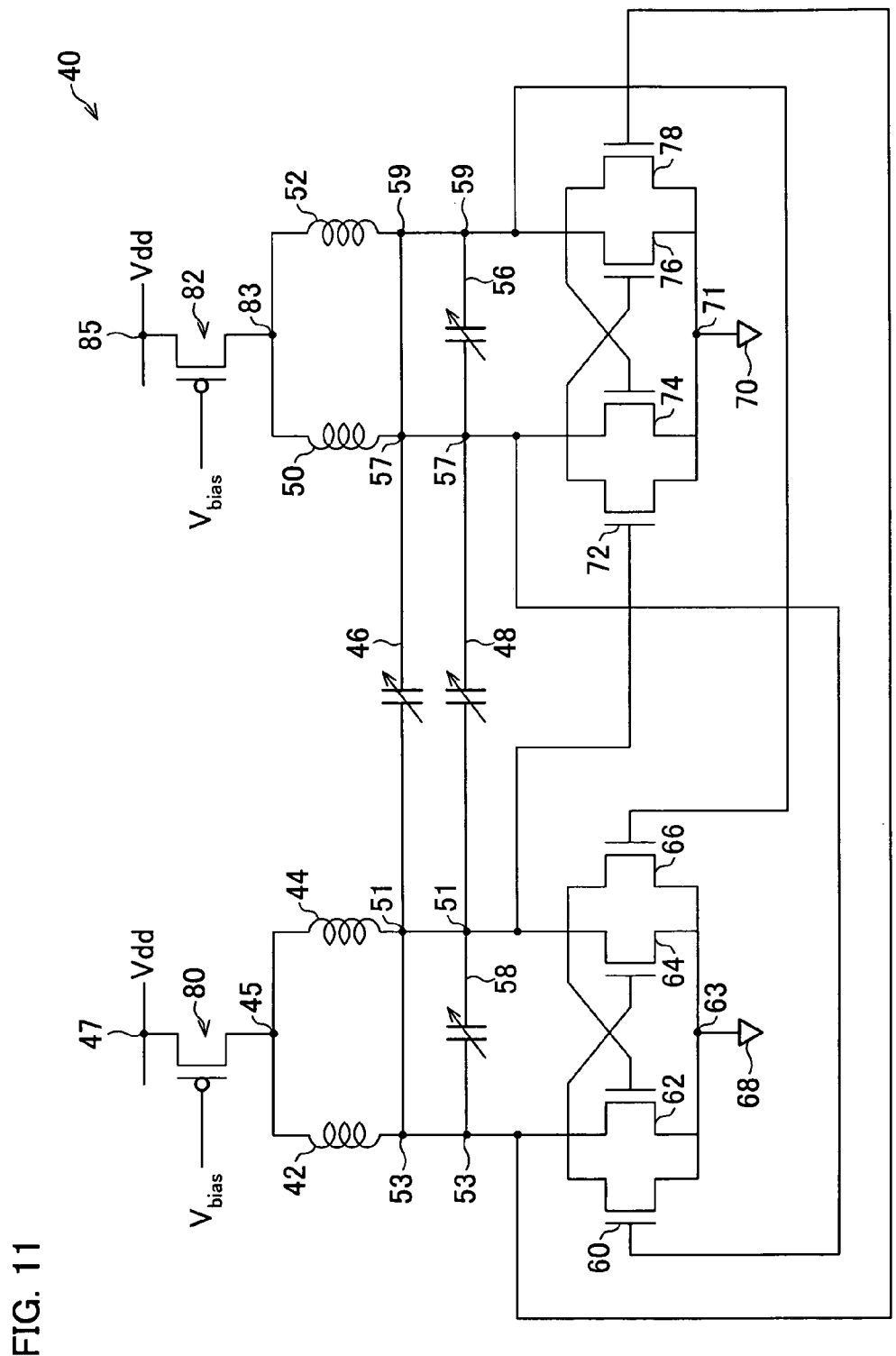
FIG. 11 is a circuit diagram illustrating a structure of a conventional oscillator.
Figure 12:
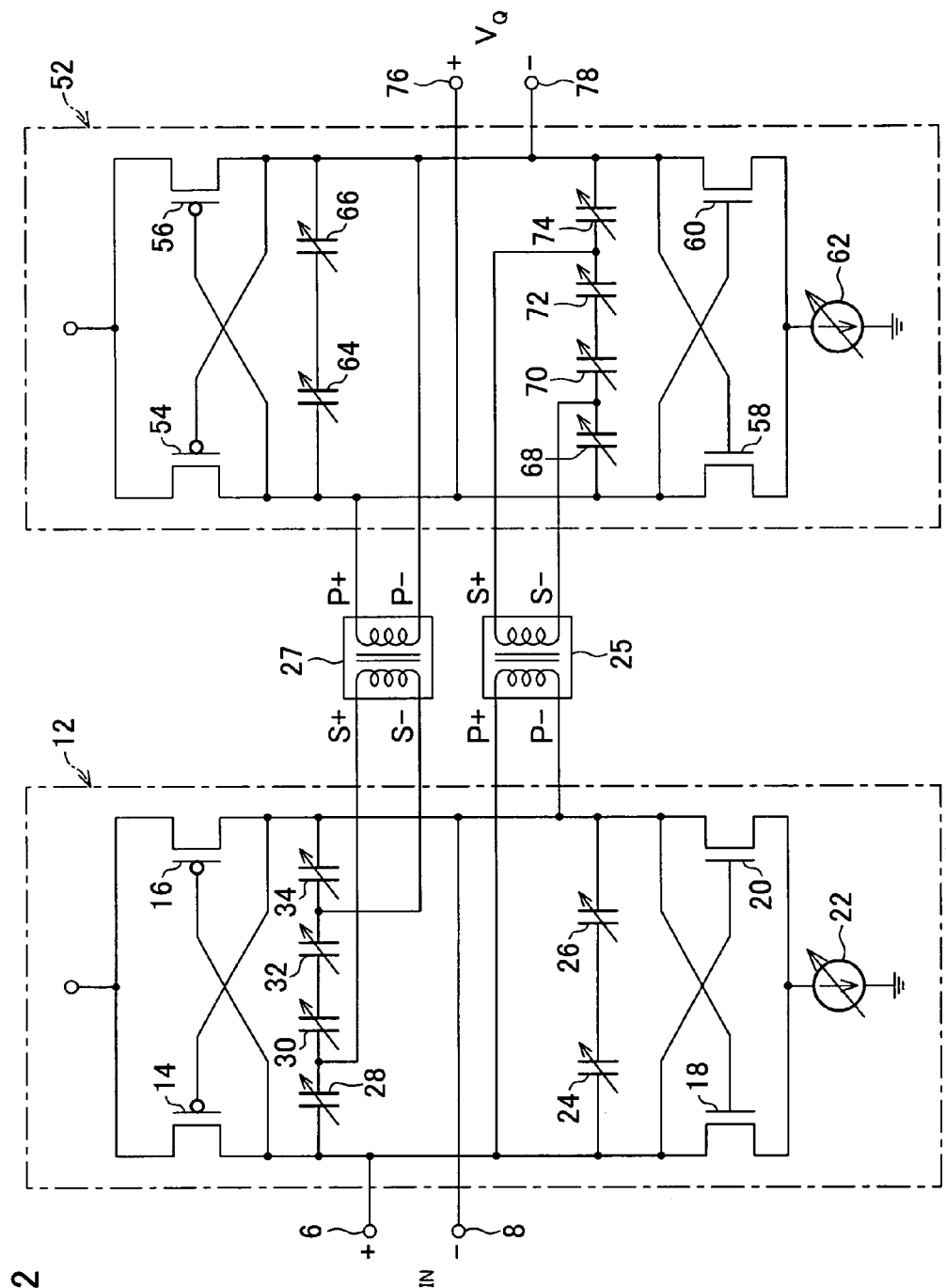
FIG. 12 is a circuit diagram illustrating a structure of a conventional oscillator.
Figure 13:
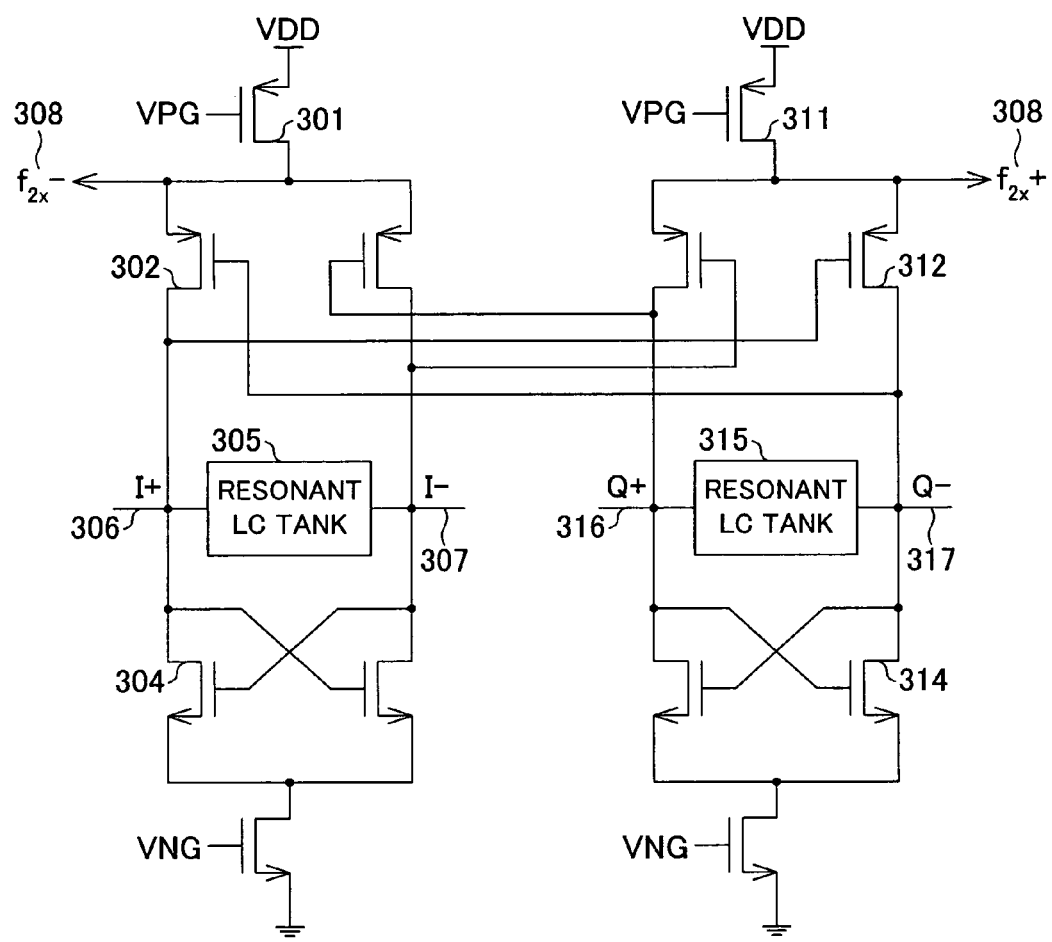
FIG. 13 is a circuit diagram illustrating a structure of a conventional oscillator.
Figure 14:
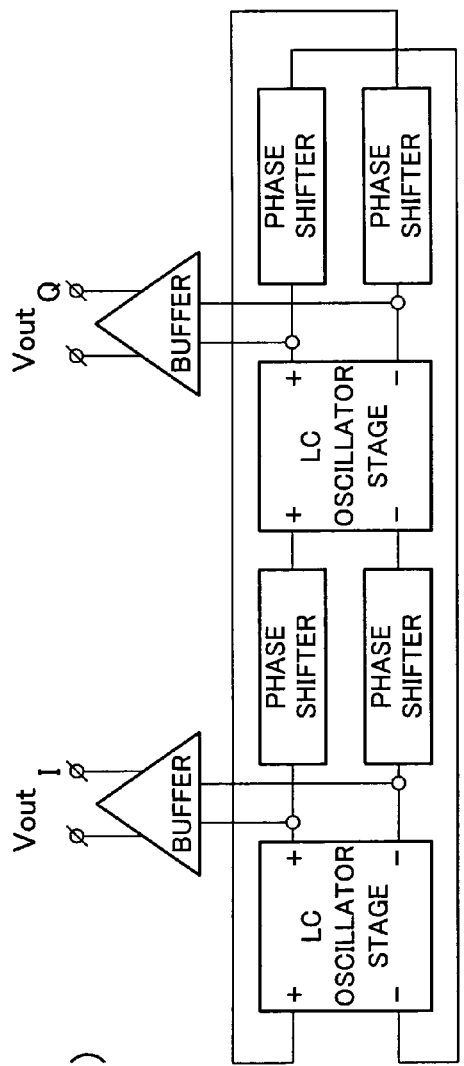
FIG. 14(a) to FIG. 14(d) are circuit diagrams each of which illustrates a structure of a conventional oscillator.
Figure 14:
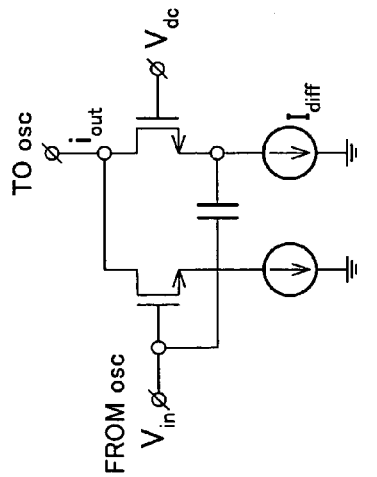
Figure 14:
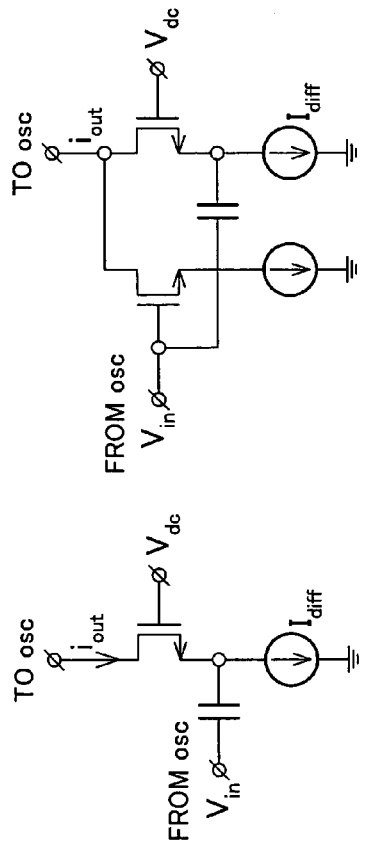
Figure 14:
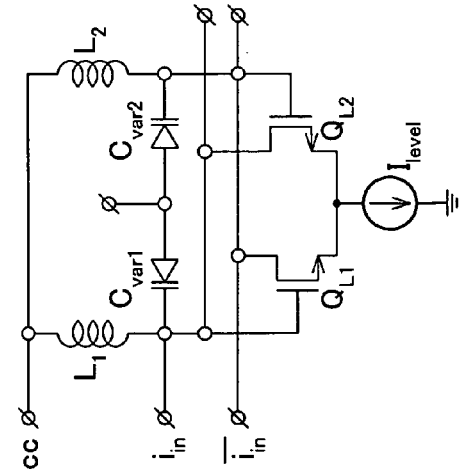
Figure 15:
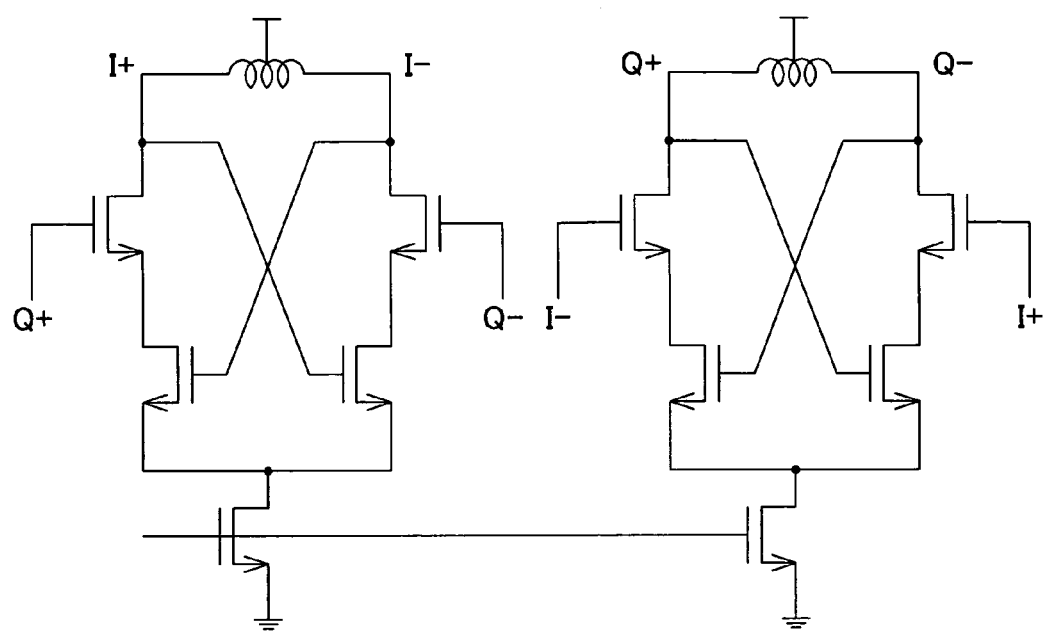
FIG. 15 is a circuit diagram illustrating a structure of a conventional oscillator.

FIG. 8 shows influence of the coupling resistor Rc on the oscillation amplitude Vopp and the oscillation frequency f of the oscillator 10. According to the figure, the effective range of the coupling resistor Rc is preferably no less than a value (0<Rc<300 (Ω)) where the graph of amplification—coupling resistance is at a minimum value (approximately 300Ω).

As described, the present embodiment uses a resistor and a capacitor connected in series so as to connect the respective transistors belonging to the oscillator A and to connect the respective transistors belonging to the oscillator B. With this arrangement, generation of noise, such as phase noise etc, is reduced compared to the conventional structure in which the connection between the transistors is made by a transistor, a transformer etc. Further, the circuit may be structured with a less number of transistors, thereby realizing a smaller circuit requiring lower power consumption.

Further, a variable resistor may be used for an arbitrary coupling resistor Rc, which allows adjustment of the resistance of the coupling resistor, thereby controlling the phase of output signal. On this account, the phase accuracy of oscillation signal is further ensured.

Further, a variable capacitor (varactor) may be used for an arbitrary coupling capacitor Cc, which allows adjustment of the capacitance of coupling capacitor, thereby controlling of the phase of output signal. On this account, the phase accuracy of oscillation signal is further ensured.

Further, the adjustment of the capacitance of variable capacitor (varactor) of the LC resonant circuit 560/570 enables a change in resonant frequency of the LC resonant circuit 560/570, thereby easily setting the frequency of output alternating signal.

Further, in the pair of transistors 501 and 502, and in the pair of transistors 511 and 512, the respective emitters are connected to the current generator Io. Therefore, by adjusting the current value of the current generator Io, it becomes possible to adjust the transconductances of the negative resistor circuits 561 and 571. On this account, the phase accuracy of oscillation signal is further ensured.

It however should be noted that it is not always necessary to use a bipolar transistor to constitute the oscillator circuit. For example, the oscillator circuit may be constituted of a MOS transistor, a GaAs-base hetero junction bipolar transistor (HBT), or a GaAs-base field effect transistor (FET).

The coupling resistor Rc (541–544) may be constituted of a small-value resistor, such as a parasitic resistor. In this case, the connections between the respective oscillator circuits substantially become capacitive connection. Further, a variable resistor may be used for an arbitrary coupling resistor Rc; similarly, a variable capacitor may be used for an arbitrary coupling capacitor Cc (520–523).

Second Embodiment

Figure 2:
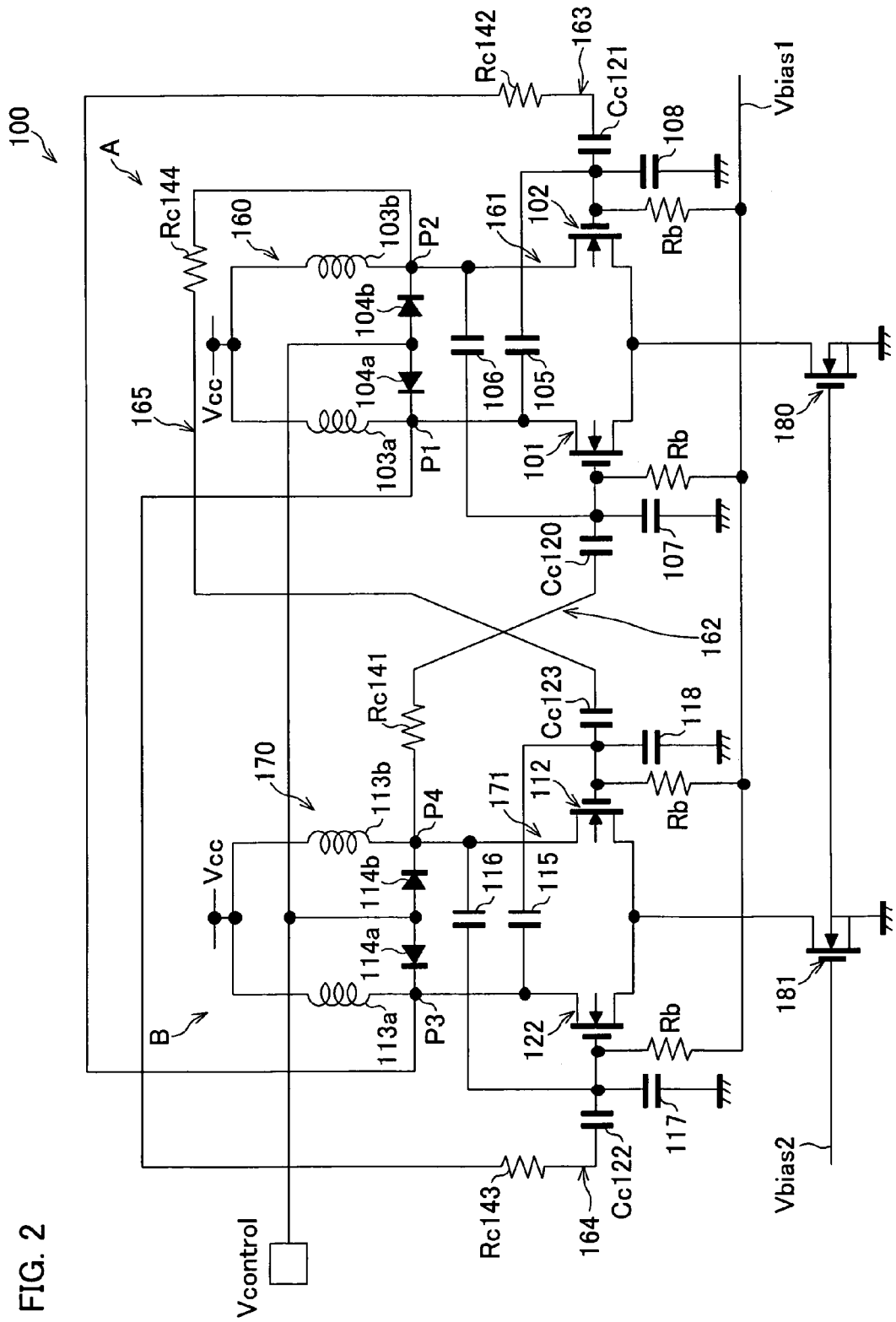
FIG. 2 is a circuit diagram illustrating a structure of an oscillator according to another embodiment of the present invention.

FIG. 2 illustrates another structure of the oscillator of the present invention. This structure includes a MOS transistor.

As shown therein, an oscillator 100 according to the present embodiment includes a pair of an oscillator circuit A (first oscillator circuit) and an oscillator circuit B (second oscillator circuit) and four RC coupling networks 162 through 165. With this structure, the oscillator 100 generates four signals (quadrature signal) at P1 through P4. The four signals have 90° phase difference to each other.

The oscillator circuit A includes an LC resonant circuit 160 and a negative resistor circuit 161. The LC resonant circuit 160 includes coils 103a and 103b, and variable capacitor diodes 104a and 104b. The negative resistor circuit 161 includes two N-channel MOS transistors 101 and 102 for use in cross-connection, four capacitors (feedback capacitor) 105, 106, 107 and 108, two resistors Rb, and an N-channel MOS transistor 180.

The coil 103a and 103b are connected in series, and the midpoint of the connection line is connected to Vcc. The variable capacitor diodes 104a and 104b are also connected in series toward opposite directions, and their anode terminals are connected to each other. The two anode terminals are further connected to Vcontrol (Vco, hereinafter). These coils 103a and 103b and the variable capacitor diodes 104a and 104b are connected in parallel.

Further, a cathode of the variable capacitor diode 104a is connected to a drain terminal of the transistor 101; and a cathode of the variable capacitor diode 104b is connected to a drain terminal of the transistor 102. Consequently, an LC resonant circuit 160 is provided between the drain terminal of the transistor 101 and the drain terminal of the transistor 102.

Further, a gate terminal of the transistor 101 is connected to a drain terminal of the transistor 102 via a capacitor 106, and a gate terminal of the transistor 102 is connected to a drain terminal of the transistor 101 via a capacitor 105.

Further, the gate terminal of the transistor 101 is connected to a potential generator Vbias1 (Vb1, hereinafter) via a resistor Rb, and the gate terminal of the transistor 102 is connected to the potential generator Vb1 via a resistor Rb. Further, the gate terminal of the transistor 101 is connected to ground via the capacitor 107, and the gate terminal of the transistor 102 is connected to ground via the capacitor 108.

Further, a source terminal of the transistor 101 is connected to a source terminal of the transistor 102. These source terminals of the transistors 101 and 102 are connected to a source terminal of the transistor 180. A drain terminal of the transistor 180 is connected to ground, and a gate terminal of the transistor 180 is connected to a potential generator Vbias 2 (Vb2, hereinafter).

The oscillator circuit B includes an LC resonant circuit 170 and a negative resistor circuit 171. The LC resonant circuit 170 includes coils 113a and 113b, and variable capacitor diodes 114a and 114b. The negative resistor circuit 171 includes two N-channel MOS transistors 122 and 112 for use in cross-connection, four capacitors (feedback capacitor) 115, 116, 117 and 118, two resistors Rb, and an N-channel MOS transistor 181.

The coil 113a and 113b are connected in series, and the midpoint of the connection line is connected to Vcc. The variable capacitor diodes 114a and 114b are also connected in series toward opposite directions, and their anode terminals are connected to each other. The two anode terminals are further connected to Vcontrol (Vco, hereinafter). These coils 113a and 113b and the variable capacitor diodes 114a and 114b are connected in parallel.

Further, a cathode of the variable capacitor diode 114a is connected to a drain terminal of the transistor 122; and a cathode of the variable capacitor diode 114b is connected to a drain terminal of the transistor 112. Consequently, an LC resonant circuit 170 is provided between the drain terminal of the transistor 122 and the drain terminal of the transistor 112.

Further, a gate terminal of the transistor 122 is connected to a drain terminal of the transistor 112 via a capacitor 116, and a gate terminal of the transistor 112 is connected to a drain terminal of the transistor 122 via a capacitor 115.

Further, the gate terminal of the transistor 122 is connected to a potential generator Vbias1 (Vb1, hereinafter) via a resistor Rb, and the gate terminal of the transistor 112 is connected to the potential generator Vb1 via a resistor Rb. Further, the gate terminal of the transistor 122 is connected to ground via the capacitor 117, and the gate terminal of the transistor 112 is connected to ground via the capacitor 118.

Further, a source terminal of the transistor 122 is connected to a source terminal of the transistor 112. These source terminals of the transistors 122 and 112 are connected to a source terminal of the transistor 181. A drain terminal of the transistor 181 is connected to ground, and a gate terminal of the transistor 181 is connected to a potential generator Vbias 2 (Vb2, hereinafter).

In this example, the oscillator 100 is structured so that the oscillator circuit A and the oscillator circuit B are connected to each other via the four RC coupling networks 162 through 165.

In the RC coupling network 162, a coupling capacitor Cc120 and a coupling resistor Rc141 are connected in series between the gate terminal of the transistor 101 and the drain terminal of the transistor 112. More specifically, one electrode of the coupling capacitor Cc120 is connected to the gate terminal of the transistor 101, and the coupling resistor Rc141 is provided between the other electrode of the coupling capacitor Cc120 and the drain terminal of the transistor 112.

In the RC coupling network 163, a coupling capacitor Cc121 and a coupling resistor Rc142 are connected in series between the gate terminal of the transistor 102 and the drain terminal of the transistor 122. More specifically, one electrode of the coupling capacitor Cc121 is connected to the gate terminal of the transistor 102, and the coupling resistor Rc142 is provided between the other electrode of the coupling capacitor Cc121 and the drain terminal of the transistor 122.

In the RC coupling network 164, a coupling capacitor Cc122 and a coupling resistor Rc143 are connected in series between the gate terminal of the transistor 122 and the drain terminal of the transistor 101. More specifically, one electrode of the coupling capacitor Cc122 is connected to the gate terminal of the transistor 122, and the coupling resistor Rc143 is provided between the other electrode of the coupling capacitor Cc122 and the drain terminal of the transistor 101.

In the RC coupling network 165, a coupling capacitor Cc123 and a coupling resistor Rc144 are connected in series between the gate terminal of the transistor 112 and the drain terminal of the transistor 102. More specifically, one electrode of the coupling capacitor Cc123 is connected to the gate terminal of the transistor 112, and the coupling resistor Rc144 is provided between the other electrode of the coupling capacitor Cc123 and the drain terminal of the transistor 102.

When the LC resonant circuit 160 receives some kind of electrical stimulation, the oscillator circuit A oscillates an alternating signal by oscillation of the LC resonant circuit 160, from an output terminal P1 and an output terminal P2. These signals outputted from the output terminals P1 and P2 are reverse-phase (complementary) signals. The frequency of this alternating signal is a resonant frequency of the LC resonant circuit 160, and can be adjusted by the variable capacitor diodes 104a and 104b serving to control voltage. This principle is also applied to the oscillator circuit B.

Further, the negative resistor circuit 161, including alternating coupling transistors 101 and 102 and feedback capacitors 105 and 106, is connected to the LC resonant circuit 160, so as to compensate the loss of the LC resonant circuit 160, thereby maintaining the oscillation of the LC resonant circuit 160. In this way, alternating signals, which are reversed in phase, are continuously fetched from the output terminals P1 (drain terminal of the transistor 101) and P2 (drain terminal of the transistor 102). This principle is also applied to the oscillator circuit B; that is, alternating signals, which are reversed in phase, are continuously fetched from the output terminals P3 (drain terminal of the transistor 122) and P4 (drain terminal of the transistor 112).

In the oscillator 100, the oscillator circuit A and the oscillator circuit B are connected via the four RC coupling networks 162 through 165. With this layout in which the oscillator circuit A and the oscillator circuit B are connected via the four RC networks (Rc141·Cc120 , Rc142·Cc121, Rc143·Cc122 and Rc144·Cc123), it is possible to make ±90° C. difference between the output signals X and Y (satisfying X=±jY) of the respective oscillator circuits. On this account, the output terminals P1 through P4 respectively output signals which differ in phase by 90° C. from each other.

Third Embodiment

Figure 3:
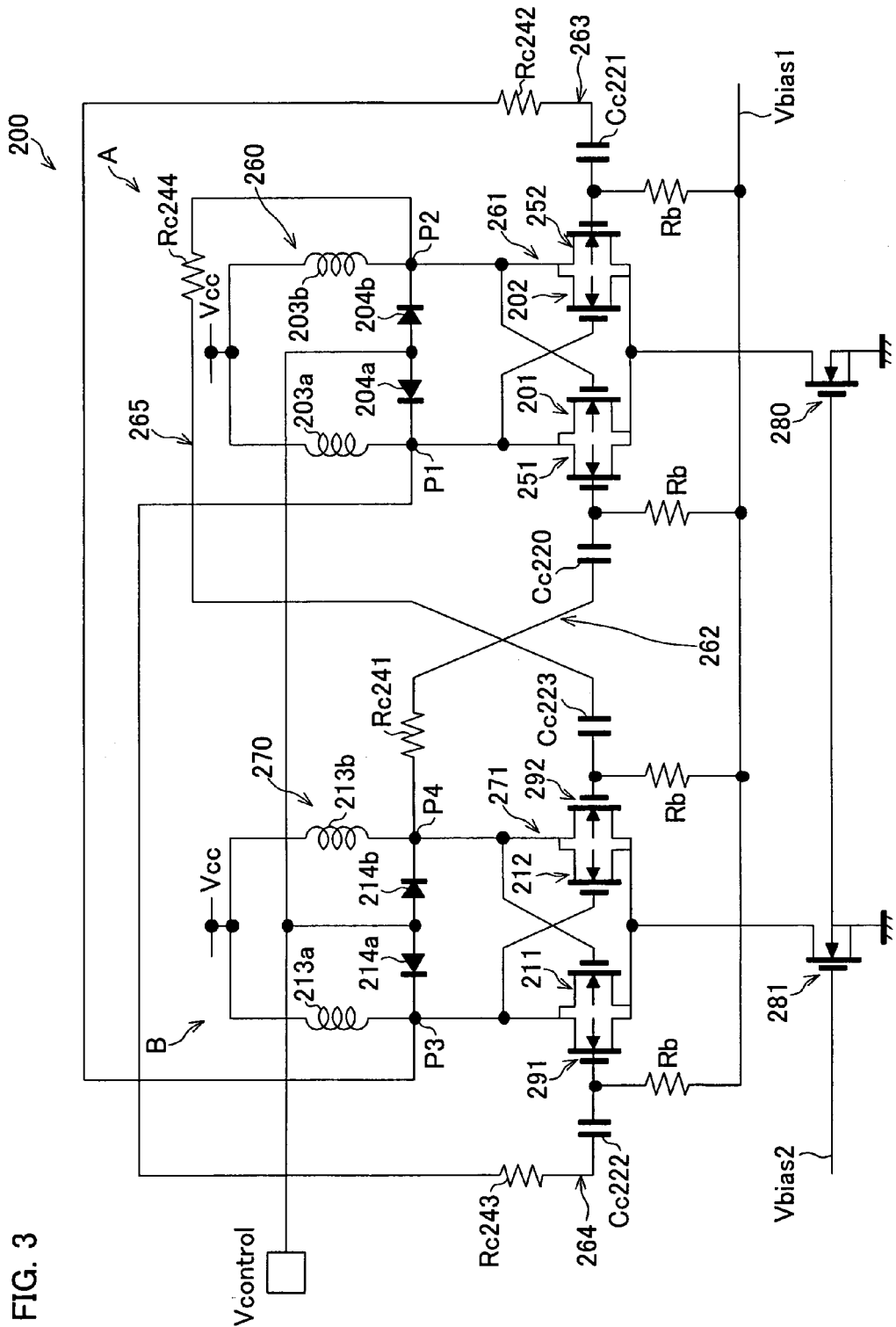
FIG. 3 is a circuit diagram illustrating a structure of an oscillator according to another embodiment of the present invention.

FIG. 3 illustrates another modification example of the oscillator using the MOS transistors.

As shown in FIG. 3, an oscillator 200 according to the present embodiment includes a pair of oscillator circuit A (first oscillator circuit) and oscillator circuit B (second oscillator circuit), and four RC coupling networks 262 through 265. In the oscillator 200, four signals (four phase signals), 90° out of phase from one another, are respectively generated at P1 through P4.

The oscillator circuit A includes a LC oscillator circuit 260 and a negative resistor circuit 261. The LC oscillator circuit 260 includes coils 203a, 203b, and varactors (variable capacitance diodes) 204a, 204b. The negative resistor circuit 261 includes two N-channel MOS transistors 201 (sixth MOS transistor) and 202 (seventh MOS transistor) for cross-connecting, two N-channel MOS transistors 251 (fifth MOS transistor) and 252 (eighth MOS transistor) for coupling, two resistors Rb, and an N-channel MOS transistor 280.

The coils 203a and 203b are serially connected to each other, and their junction is connected to Vcc. The varactors 204a and 204b are serially connected to each other in opposite directions. The anode terminals of the varactors 204a and 204b are connected to each other and to the Vcontrol ("Vco" hereinafter). The coils 203a, 203b and the varactors 204a, 204b are connected to each other in parallel.

The transistors 251 and 201 are connected to each other at their drain terminals and source terminals. The transistors 252 and 202 are connected to each other at their drain terminals and source terminals.

The drain terminals of the transistors 201 and 251 are connected in common to the cathode of the varactor 204a, and the drain terminals of the transistors 252 and 202 are connected in common to the cathode of the varactor 204b. In this manner, the LC oscillator circuit 260 is connected between the common drain terminal of the transistors 201 and 251 and the common drain terminal of the transistors 202 and 252.

The transistor 201 has its gate terminal connected to the common drain terminal of the transistors 202 and 252, and the transistor 202 has its gate terminal connected to the common drain terminal of the transistors 201 and 251.

The transistor 251 has its gate terminal connected to a constant potential supply Vbias1 ("Vb1" hereinafter) via the resistor Rb, and the transistor 252 has its gate terminal connected to the constant potential supply Vb1 via the resistor Rb.

The common source terminal of the transistors 201 and 251 is connected to the common source terminal of the transistors 202 and 252, and the junction of the transistors 201, 251 and the transistors 202, 252 is connected to a source terminal of the transistor 280. The transistor 280 has its drain terminal grounded, and gate terminal connected to a constant potential supply Vbias2 ("Vb2" hereinafter).

The oscillator circuit B includes a LC oscillator circuit 270 and a negative resistor circuit 271. The LC oscillator circuit 270 includes coils 213a and 213b, and varactors 214a and 214b. The negative resistor circuit 271 includes two N-channel MOS transistors 211 (second MOS transistor) and 212 (third MOS transistor) for cross-connecting, two N-channel MOS transistors 291 (first MOS transistor) and 292 (fourth MOS transistor) for coupling, two resistors Rb, and an N-channel MOS transistor 281.

The coils 213a and 213b are serially connected to each other, and the junction of the coils 213a and 213b are connected to Vcc. The varactors 214a and 214b are serially connected to each other in opposite directions. The anode terminals of the varactors 214a and 214b are connected to each other and to the Vcontrol ("Vco" hereinafter). The coils 213a, 213b and the varactors 214a, 214b are connected to each other in parallel.

The transistors 291 and 211 are connected to each other at their drain terminals and source terminals. The transistors 292 and 212 are connected to each other at their drain terminals and source terminals.

The drain terminals of the transistors 291 and 211 are connected in common to the cathode of the varactor 214a, and the drain terminals of the transistors 292 and 212 are connected in common to the cathode of the varactor 214b. In this manner, the LC oscillator circuit 270 is connected between the common drain terminal of the transistors 291 and 211 and the common drain terminal of the transistors 292 and 212.

The transistor 211 has its gate terminal connected to the common drain terminal of the transistors 212 and 292, and the transistor 212 has its gate terminal connected to the common drain terminal of the transistors 211 and 291.

The transistor 291 has its gate terminal connected to the constant potential supply Vbias1 ("Vb1" hereinafter) via the resistor Rb, and the transistor 292 has its gate terminal connected to the constant potential supply Vb1 via the resistor Rb.

The common source terminal of the transistors 211 and 291 is connected to the common source terminal of the transistors 212 and 292, and the junction of the transistors 211, 291 and the transistors 212, 292 is connected to a source terminal of the transistor 281. The transistor 281 has its drain terminal grounded, and gate terminal connected to the constant potential supply Vbias2 ("Vb2" hereinafter).

In the oscillator 200, the oscillator circuit A and the oscillator circuit B are connected to each other by the four RC coupling networks 262 through 265.

In the RC coupling network 262, a coupling capacitor Cc220 and a coupling resistor Rc241 are serially connected to each other between the gate terminal of the transistor 251 and the drain terminal of the transistor 212 (292). In other words, one of the electrodes of the coupling capacitor Cc220 is connected to the gate terminal of the transistor 251, and the coupling resistor Rc241 is connected between the other electrode of the coupling capacitor Cc220 and the drain terminal of the transistor 212 (292).

In the RC coupling network 263, a coupling capacitor Cc221 and a coupling resistor Rc242 are serially connected to each other between the gate terminal of the transistor 252 and the drain terminal of the transistor 211 (291). In other words, one of the electrodes of the coupling capacitor Cc221 is connected to the gate terminal of the transistor 252, and the coupling resistor Rc242 is connected between the other electrode of the coupling capacitor Cc221 and the drain terminal of the transistor 211 (291).

In the RC coupling network 264, a coupling capacitor Cc222 and a coupling resistor Rc243 are serially connected to each other between the gate terminal of the transistor 291 and the drain terminal of the transistor 201 (251). In other words, one of the electrodes of the coupling capacitor Cc222 is connected to the gate terminal of the transistor 291, and the coupling resistor Rc243 is connected between the other electrode of the coupling capacitor Cc222 and the drain terminal of the transistor 201 (251).

In the RC coupling network 265, a coupling capacitor Cc223 and a coupling resistor Rc244 are serially connected to each other between the gate terminal of the transistor 292 and the drain terminal of the transistor 202 (252). In other words, one of the electrodes of the coupling capacitor Cc223 is connected to the gate terminal of the transistor 292, and the coupling resistor Rc244 is connected between the other electrode of the coupling capacitor Cc223 and the drain terminal of the transistor 202 (252).

In the oscillator circuit A, the LC oscillator circuit 260 oscillates to generate an AC signal in response to an applied electrical stimulus, and outputs the AC signal from the output terminals P1 and P2. Here, the output signals at the output terminals P1 and P2 are of the opposite (complementary) phases. The AC signals have the oscillating frequency of the LC oscillator circuit 260, and the frequency of the AC signals can be adjusted by the varactors 204a and 204b of a voltage control type. The same principle applies to the oscillator circuit B as well.

Owning to the fact that the negative resistor circuit 261 including the cross-connected coupling transistors 201 and 251 and the transistors 202 and 251 is connected to the LC oscillator circuit 260, a loss at the LC oscillator circuit 260 is compensated and therefore oscillation of the LC oscillator circuit 260 is sustained. As a result, the AC signals of opposite phases can be continuously obtained from the output terminals P1 (common drain terminal of the transistors 201 and 251) and P2 (common drain terminal of the transistors 202 and 252). Similarly, in the oscillator circuit B, the AC signals of opposite phases can be continuously obtained from the output terminals P3 (common drain terminal of the transistors 211 and 291) and P4 (common drain terminal of the transistors 212 and 292).

In the oscillator 200, the oscillator circuit A and the oscillator circuit B are connected to each other by the four RC coupling networks 262 through 265. With the oscillator circuits A and B joined together by the four RC coupling networks (Rc241 and Cc220, Rc242 and Cc221, Rc243 and Cc222, Rc244 and Cc223), the output signals X and Y of the respective oscillator circuits A and B can be obtained with a ±90° phase difference (X=±jY). In this manner, the output terminals P1 through P4 can output four phase signals that are 90° out of phase from one another.

A frequency adjusting system based on the present oscillator is applicable to a data communication device, e.g., a mobile phone transceiver for carrying out radio data communications based on IEEE802.11X standard.

As described above, according to the oscillator of the present invention, the series-connected resistor and capacitor are used for the coupling between the transistors belonging to the first oscillator circuit and the transistors belonging to the second oscillator circuit. Therefore, the arrangement of the present invention reduces noise generation as compared with the conventional arrangement in which this coupling is made by using a plurality of transistors, a plurality of transformers, or the like. Besides, the arrangement of the present invention reduces transistor counts, thus realizing lower power consumption and scale-down of a circuit.

Further, in the above arrangement, the coupling resistor is preferably a variable resistor. According to this arrangement, by adjusting a resistance value of the coupling resistor, phases of the output signals are controlled. This allows for increase in phase accuracy of the oscillation signal.

Still further, in the above arrangement, the coupling capacitor is preferably a variable capacitor. According to this arrangement, by adjusting a capacitance value of the coupling capacitor, phases of the output signals are controlled. This allows for increase in phase accuracy of the oscillation signal.

Yet further, in the above arrangement, the resonant circuit is preferably an LC resonant circuit including a variable capacity (e.g. varactor). According to this arrangement, it is possible to change a resonance frequency of the resonant circuit by adjusting the capacitance of the variable capacity. Thus, it is possible to easily set a frequency of the outputted alternating signal.

In the above arrangement, it is preferable that a pair of the first and second transistors is provided so that the first conductive terminals are connected to a constant current source and a pair of the third and fourth transistors is provided so that the first conductive terminals are connected to a constant power source. According to this arrangement, it is possible to set a transconductance value of the negative resistance circuit which is made up of the pair of transistors, by adjusting a current value of the constant current source. This allows for increase in phase accuracy of the oscillation signal.

In the above arrangement, each of the transistors may be an NPN-type bipolar transistor. In this case, the first and second conductive terminals are an emitter terminal and a collector terminal, respectively, and the control terminal is a base terminal.

In the above arrangement, each of the transistors may be an N-channel MOS transistor. In this case, the first and second conductive terminals are a source terminal and a drain terminal, respectively, and the control terminal is a gate terminal.

Further, a communication device including the present oscillator has the foregoing advantages.

The present invention is not limited to the description of the embodiments above, but may be altered by a skilled person within the scope of the claims. An embodiment based on a proper combination of technical means disclosed in different embodiments is encompassed in the technical scope of the present invention.

What is claimed is:

1. An oscillator, comprising: a first oscillator circuit which has a resonant circuit and a plurality of transistors; and a second oscillator circuit which has a resonant circuit and a plurality of transistors, wherein:

the first oscillator circuit is provided with first and second transistors so that a first conductive terminal of the first transistor is connected to a first conductive terminal of the second transistor and a second conductive terminal of the first transistor and a second conductive terminal of the second transistor are respectively connected to the resonant circuit, and the second conductive terminal of the first transistor is connected to a control terminal of the second transistor directly or via a capacitor, and a control terminal of the first transistor is connected to the second conductive terminal of the second transistor directly or via a capacitor, and the second oscillator circuit is provided with third and fourth transistors so that a first conductive terminal of the third transistor is connected to a first conductive terminal of the fourth transistor and a second conductive terminal of the third transistor and a second conductive terminal of the fourth transistor are respectively connected to the resonant circuit, and the second conductive terminal of the third transistor is connected to a control terminal of the fourth transistor directly or via a capacitor, and a control terminal of the third transistor is connected to the second conductive terminal of the fourth transistor directly or via a capacitor, and a coupling capacitor and a coupling resistor are serially provided between the second conductive terminal of the first transistor and the control terminal of the fourth transistor, and a coupling capacitor and a coupling resistor are serially provided between the second conductive terminal of the second transistor and the control terminal of the third transistor, and a coupling capacitor and a coupling resistor are serially provided between the second conductive terminal of the third transistor and the control terminal of the first transistor, and a coupling capacitor and a coupling resistor are serially provided between the second conductive terminal of the fourth transistor and the control terminal of the second transistor.

2. An oscillator, comprising: a first oscillator circuit which has a resonant circuit and a plurality of transistors; and a second oscillator circuit which has a resonant circuit and a plurality of transistors, wherein:

the first oscillator circuit is provided with (i) first and second MOS transistors so that a first conductive terminal of the first MOS transistor is connected to a first conductive terminal of the second MOS transistor and a second conductive terminal of the first MOS transistor is connected to a second conductive terminal of the second MOS transistor and (ii) third and fourth MOS transistors so that a first conductive terminal of the third MOS transistor is connected to a first conductive terminal of the fourth MOS transistor and a second conductive terminal of the third MOS transistor is connected to a second conductive terminal of the fourth MOS transistor, and the first conductive terminal of the second MOS transistor is connected to the first conductive terminal of the third MOS transistor, and the second conductive terminal of the second MOS transistor and the second conductive terminal of the third MOS transistor are respectively connected to the resonant circuit, and the second conductive terminal of the second MOS transistor is connected to a control terminal of the third MOS transistor, and a control terminal of the second MOS transistor is connected to the second conductive terminal of the third MOS transistor, and the second oscillator circuit is provided with (i) fifth and sixth MOS transistors so that a first conductive terminal of the fifth MOS transistor is connected to a first conductive terminal of the sixth MOS transistor and a second conductive terminal of the fifth MOS transistor is connected to a second conductive terminal of the sixth MOS transistor and (ii) seventh and eighth MOS transistors so that a first conductive terminal of the seventh MOS transistor is connected to a first conductive terminal of the eighth MOS transistor and a second conductive terminal of the seventh MOS transistor is connected to a second conductive terminal of the eighth MOS transistor, and the first conductive terminal of the sixth MOS transistor is connected to the first conductive terminal of the seventh MOS transistor, and the second conductive terminal of the sixth MOS transistor and the second conductive terminal of the seventh MOS transistor are respectively connected to the resonant circuit, and the second conductive terminal of the sixth MOS transistor is connected to a control terminal of the seventh MOS transistor, and a control terminal of the sixth MOS transistor is connected to the second conductive terminal of the seventh MOS transistor, and a coupling capacitor and a coupling resistor are serially provided between (a) the second conductive terminals of the fifth and sixth MOS transistors and (b) the control terminal of the first MOS transistor, and a coupling capacitor and a coupling resistor are serially provided between (c) the second conductive terminals of the seventh and eighth MOS transistors and (d) the control terminal of the fourth MOS transistor, and a coupling capacitor and a coupling resistor are serially provided between (e) the second conductive terminals of the third and fourth MOS transistors and (f) the control terminal of the fifth MOS transistor, and a coupling capacitor and a coupling resistor are serially provided between (g) the second conductive terminals of the first and second MOS transistors and (h) the control terminal of the eighth MOS transistor.

3. The oscillator as set forth in claim 1, wherein the coupling resistor includes a variable resistor.

4. The oscillator as set forth in claim 2, wherein the coupling resistor includes a variable resistor.

5. The oscillator as set forth in claim 1, wherein the coupling capacitor includes a variable capacitor.

6. The oscillator as set forth in claim 2, wherein the coupling capacitor includes a variable capacitor.

7. The oscillator as set forth in claim 1, wherein the resonant circuit is an LC resonant circuit including a variable capacitor.

8. The oscillator as set forth in claim 2, wherein the resonant circuit is an LC resonant circuit including a variable capacitor.

9. The oscillator as set forth in claim 1, wherein a pair of the first and second transistors is provided so that the first conductive terminals are connected to a constant current source and a pair of the third and fourth transistors is provided so that the first conductive terminals are connected to a constant power source.

10. The oscillator as set forth in claim 1, wherein each of the transistors is an NPN-type transistor, and each of the first conductive terminals is an emitter terminal and each of the second conductive terminals is a collector terminal, and each of the control terminals is a base terminal.

11. The oscillator as set forth in claim 1, wherein each of the transistors is an N-channel MOS transistor, and each of the first conductive terminals is a source terminal and each of the second conductive terminals is a drain terminal, and each of the control terminals is a gate terminal.

12. A communication device, comprising an oscillator which includes: a first oscillator circuit which has a resonant circuit and a plurality of transistors; and a second oscillator circuit which has a resonant circuit and a plurality of transistors, wherein:

the first oscillator circuit is provided with first and second transistors so that a first conductive terminal of the first transistor is connected to a first conductive terminal of the second transistor and a second conductive terminal of the first transistor and a second conductive terminal of the second transistor are respectively connected to the resonant circuit, and the second conductive terminal of the first transistor is connected to a control terminal of the second transistor directly or via a capacitor, and a control terminal of the first transistor is connected to the second conductive terminal of the second transistor directly or via a capacitor, and the second oscillator circuit is provided with third and fourth transistors so that a first conductive terminal of the third transistor is connected to a first conductive terminal of the fourth transistor and a second conductive terminal of the third transistor and a second conductive terminal of the fourth transistor are respectively connected to the resonant circuit, and the second conductive terminal of the third transistor is connected to a control terminal of the fourth transistor directly or via a capacitor, and a control terminal of the third transistor is connected to the second conductive terminal of the fourth transistor directly or via a capacitor, and a coupling capacitor and a coupling resistor are serially provided between the second conductive terminal of the first transistor and the control terminal of the fourth transistor, and a coupling capacitor and a coupling resistor are serially provided between the second conductive terminal of the second transistor and the control terminal of the third transistor, and a coupling capacitor and a coupling resistor are serially provided between the second conductive terminal of the third transistor and the control terminal of the first transistor, and a coupling capacitor and a coupling resistor are serially provided between the second conductive terminal of the fourth transistor and the control terminal of the second transistor.

13. A communication device, comprising an oscillator which includes: a first oscillator circuit which has a resonant circuit and a plurality of transistors; and a second oscillator circuit which has a resonant circuit and a plurality of transistors, wherein:

the first oscillator circuit is provided with (i) first and second MOS transistors so that a first conductive terminal of the first MOS transistor is connected to a first conductive terminal of the second MOS transistor and a second conductive terminal of the first MOS transistor is connected to a second conductive terminal of the second MOS transistor and (ii) third and fourth MOS transistors so that a first conductive terminal of the third MOS transistor is connected to a first conductive terminal of the fourth MOS transistor and a second conductive terminal of the third MOS transistor is connected to a second conductive terminal of the fourth MOS transistor, and the first conductive terminal of the second MOS transistor is connected to the first conductive terminal of the third MOS transistor, and the second conductive terminal of the second MOS transistor and the second conductive terminal of the third MOS transistor are respectively connected to the resonant circuit, and the second conductive terminal of the second MOS transistor is connected to a control terminal of the third MOS transistor, and a control terminal of the second MOS transistor is connected to the second conductive terminal of the third MOS transistor, and the second oscillator circuit is provided with (i) fifth and sixth MOS transistors so that a first conductive terminal of the fifth MOS transistor is connected to a first conductive terminal of the sixth MOS transistor and a second conductive terminal of the fifth MOS transistor is connected to a second conductive terminal of the sixth MOS transistor and (ii) seventh and eighth MOS transistors so that a first conductive terminal of the seventh MOS transistor is connected to a first conductive terminal of the eighth MOS transistor and a second conductive terminal of the seventh MOS transistor is connected to a second conductive terminal of the eighth MOS transistor, and the first conductive terminal of the sixth MOS transistor is connected to the first conductive terminal of the seventh MOS transistor, and the second conductive terminal of the sixth MOS transistor and the second conductive terminal of the seventh MOS transistor are respectively connected to the resonant circuit, and the second conductive terminal of the sixth MOS transistor is connected to a control terminal of the seventh MOS transistor, and a control terminal of the sixth MOS transistor is connected to the second conductive terminal of the seventh MOS transistor, and a coupling capacitor and a coupling resistor are serially provided between (a) the second conductive terminals of the fifth and sixth MOS transistors and (b) the control terminal of the first MOS transistor, and a coupling capacitor and a coupling resistor are serially provided between (c) the second conductive terminals of the seventh and eighth MOS transistors and (d) the control terminal of the fourth MOS transistor, and a coupling capacitor and a coupling resistor are serially provided between (e) the second conductive terminals of the third and fourth MOS transistors and (f) the control terminal of the fifth MOS transistor, and a coupling capacitor and a coupling resistor are serially provided between (g) the second conductive terminals of the first and second MOS transistors and (h) the control terminal of the eighth MOS transistor.

* * * * *

UNITED STATES PATENT AND TRADEMARK OFFICE
CERTIFICATE OF CORRECTION

PATENT NO.       : 7,239,209 B2                                    Page 1 of 1
APPLICATION NO.  : 11/253732
DATED            : July 3, 2007
INVENTOR(S)      : Alberto O. Adan It is certified that error appears in the above-identified patent and that said Letters Patent is hereby corrected as shown below:

On The Title Page, Item (54)
Please correct the Title of the Invention to read:

--OSCILLATOR AND COMMUNICATION DEVICE--.

Signed and Sealed this

Thirtieth Day of October, 2007

JON W. DUDAS
*Director of the United States Patent and Trademark Office*